United States Patent
Kikuta et al.

(10) Patent No.: US 10,778,247 B2
(45) Date of Patent: Sep. 15, 2020

(54) CIRCUIT DEVICE, ELECTRO-OPTICAL DEVICE, ELECTRONIC APPARATUS, MOBILE BODY, AND ERROR DETECTION METHOD

(71) Applicant: SEIKO EPSON CORPORATION, Tokyo (JP)

(72) Inventors: Kazuto Kikuta, Toyonaka (JP); Chisato Higuchi, Fuchu (JP)

(73) Assignee: SEIKO EPSON CORPORATION, Tokyo (JP)

( * ) Notice: Subject to any disclaimer, the term of this patent is extended or adjusted under 35 U.S.C. 154(b) by 121 days.

(21) Appl. No.: 16/060,063

(22) PCT Filed: Nov. 18, 2016

(86) PCT No.: PCT/JP2016/084285
§ 371 (c)(1),
(2) Date: Jun. 7, 2018

(87) PCT Pub. No.: WO2017/104346
PCT Pub. Date: Jun. 22, 2017

(65) Prior Publication Data
US 2019/0013826 A1 Jan. 10, 2019

(30) Foreign Application Priority Data

Dec. 15, 2015 (JP) .................. 2015-243867
Oct. 26, 2016 (JP) .................. 2016-209415
Oct. 26, 2016 (JP) .................. 2016-209416

(51) Int. Cl.
*H03M 13/09* (2006.01)
*H04N 7/18* (2006.01)
(Continued)

(52) U.S. Cl.
CPC ............ *H03M 13/093* (2013.01); *G09G 5/00* (2013.01); *H04L 1/0061* (2013.01); *H04N 7/183* (2013.01); *H04N 19/89* (2014.11); *G06F 11/004* (2013.01)

(58) Field of Classification Search
None
See application file for complete search history.

(56) References Cited

U.S. PATENT DOCUMENTS 5,990,852 A   11/1999  Szamrej
6,611,561 B1   8/2003  Hannuksela et al.
(Continued)

FOREIGN PATENT DOCUMENTS

JP   H08-018756 A   1/1996
JP   2002-537736 A   11/2002
(Continued)

OTHER PUBLICATIONS

Jul. 12, 2019 Extended Search Report issued in European Patent Appleiation No. 16875330.9.
(Continued)

*Primary Examiner* — Phung M Chung
(74) *Attorney, Agent, or Firm* — Oliff PLC

(57) ABSTRACT

A circuit device in which a processing load of a processing device with respect to error detection performed on image data can be reduced, and an electro-optical device, an electronic apparatus, a mobile body, an error detection method and the like. The circuit device includes: an interface unit that receives image data; and an error detection unit that performs error detection. The interface unit receives the image data including display image data and error detection data that includes at least position information regarding an error detection region, and the error detection unit performs the error detection on the display image data based on the (Continued)

display image data of the error detection region that is specified by the position information.

16 Claims, 15 Drawing Sheets

(51) Int. Cl.
*H04N 19/89* (2014.01)
*G09G 5/00* (2006.01)
*H04L 1/00* (2006.01)
*G06F 11/00* (2006.01)

(56) References Cited

U.S. PATENT DOCUMENTS

| | | | | |
|---|---|---|---|---|
| 7,707,703 | B2* | 5/2010 | Gilbert | F16D 3/48 29/434 |
| 8,583,999 | B2* | 11/2013 | Morino | G06F 11/1004 714/807 |

| | | | |
|---|---|---|---|
| 2011/0102163 | A1 | 5/2011 | Mizutani et al. |
| 2012/0036418 | A1 | 2/2012 | Morino et al. |
| 2012/0120107 | A1 | 5/2012 | Nakanishi et al. |

FOREIGN PATENT DOCUMENTS

| | | |
|---|---|---|
| JP | 2002-369204 A | 12/2002 |
| JP | 2003-259375 A | 9/2003 |
| JP | 2007-072394 A | 3/2007 |
| JP | 2007-101691 A | 4/2007 |
| JP | 2011-093465 A | 5/2011 |
| JP | 2012-035677 A | 2/2012 |
| JP | 2014-003512 A | 1/2014 |
| JP | 2014-130657 A | 7/2014 |
| JP | 2015-131635 A | 7/2015 |
| WO | 2000/049810 A1 | 8/2000 |

OTHER PUBLICATIONS

Feb. 14, 2017 Search Report issued in International Patent Application No. PCT/JP2016/084285.

* cited by examiner

| Pixel | R[7:0] | G[7:0] | B[7:0] |
|---|---|---|---|
| 0 | — | — | — |
| 1 | — | — | — |
| 2 | — | — | — |
| 3 | — | — | — |
| ... | ... | ... | ... |
| i | vs0[7:0] | hs0[7:0] | — |
| i+1 | vs0[10:8] | hs0[10:8] | — |
| i+2 | ve0[7:0] | he0[7:0] | — |
| i+3 | ve0[10:8] | he0[10:8] | — |
| i+4 | crcr0[7:0] | crcg0[7:0] | crcb0[7:0] |
| i+5 | crcr0[15:8] | crcg0[15:8] | crcb0[15:8] |
| i+6 | vs1[7:0] | hs1[7:0] | — |
| i+7 | vs1[10:8] | hs1[10:8] | — |
| i+8 | ve1[7:0] | he1[7:0] | — |
| i+9 | ve1[10:8] | he1[10:8] | — |
| i+10 | crcr1[7:0] | crcg1[7:0] | crcb1[7:0] |
| i+11 | crcr1[15:8] | crcg1[15:8] | crcb1[15:8] |
| i+12 | vs2[7:0] | hs2[7:0] | — |
| i+13 | vs2[10:8] | hs2[10:8] | — |
| i+14 | ve2[7:0] | he2[7:0] | — |
| i+15 | ve2[10:8] | he2[10:8] | — |
| i+16 | crcr2[7:0] | crcg2[7:0] | crcb2[7:0] |
| i+17 | crcr2[15:8] | crcg2[15:8] | crcb2[15:8] |
| i+18 | vs3[7:0] | hs3[7:0] | — |
| i+19 | vs3[10:8] | hs3[10:8] | — |
| i+20 | ve3[7:0] | he3[7:0] | — |
| i+21 | ve3[10:8] | he3[10:8] | — |
| i+22 | crcr3[7:0] | crcg3[7:0] | crcb3[7:0] |
| i+23 | crcr3[15:8] | crcg3[15:8] | crcb3[15:8] |
| ... | ... | ... | ... |

FIG. 6

FIRST FRAME

SECOND FRAME

THIRD FRAME

FOURTH FRAME

CIRCUIT DEVICE, ELECTRO-OPTICAL DEVICE, ELECTRONIC APPARATUS, MOBILE BODY, AND ERROR DETECTION METHOD

TECHNICAL FIELD

The present invention relates to circuit devices, electro-optical devices, electronic apparatuses, mobile bodies, error detection methods, and the like.

BACKGROUND ART

When display control is performed on a display device (liquid-crystal display device, for example), a processing device such as a CPU transmits image data and a control signal to a display controller, the display controller performs image processing and generates a timing signal, and a driver operates based on the image data subjected to image processing and the timing signal. The image data is transmitted from the processing device to the display controller using an LVDS (Low Voltage Differential Signal) method or a digital RGB method, for example. In any case, an error may occur in the image data due to a communication error or the like. For example, in Patent Documents 1 to 3, a method is disclosed in which a display controller performs error detection on image data received from a processing device, using CRC (Cyclic Redundancy Check).

CITATION LIST

Patent Literature

Patent Document 1: JP-A-2012-35677
Patent Document 2: JP-A-2007-101691
Patent Document 3: JP-A-2007-72394

SUMMARY OF INVENTION

Technical Problem

In such error detection, a processing device obtains expectation value information (CRC expectation value, for example) for error detection from image data to be transmitted to a display controller, and the display controller obtains a calculated value (CRC value, for example) for error detection from the image data received from the processing device, and performs the error detection by comparing the expectation value information with the calculated value. Therefore, a processing load for obtaining the expectation value information for error detection is incurred in the processing device. For example, when all pieces of image data for one frame image is subjected to error detection, the amount of data used for calculating the expectation value information becomes excessive, and the processing load increases. Although a method is conceivable in which the region subjected to the error detection is reduced (only a portion of an image is subjected to error detection), an error cannot be detected in the image in a region other than the region subjected to error detection.

According to some aspects of the invention, a circuit device in which a processing load of a processing device when error detection is performed on image data can be reduced, an electro-optical device, an electronic apparatus, a mobile body, an error detection method, and the like can be provided.

Solution to Problem

One aspect of the invention relates to a circuit device including: an interface unit that receives image data; and an error detection unit that performs error detection. The interface unit receives the image data including display image data and error detection data that includes at least position information regarding an error detection region, and the error detection unit performs the error detection on the display image data based on the display image data of the error detection region that is specified by the position information.

According to one aspect of the invention, both the display image data and the error detection data are received by the interface unit that receives image data. Also, the error detection data includes position information regarding the error detection region. In this way, the error detection data can be received by an interface similar to the interface that receives image data. Accordingly, the error detection region can be flexibly set for each frame, and a reduction in the processing load in error detection and the like can be realized.

Also, in one aspect of the invention, the error detection data further includes expectation value information that is used in the error detection, and the error detection unit may perform the error detection based on the expectation value information.

In this way, appropriate error detection can be performed using error detection information including the expectation value information.

Also, in one aspect of the invention, the image data may include second to $n^{th}$ pieces of error detection data (n is an integer of two or more), and $i^{th}$ (i is an integer that satisfies $2 \leq i \leq$) error detection amount data of the second to $n^{th}$ pieces of error detection data may include the position information corresponding to an $i^{th}$ error detection region.

In this way, a plurality of error detection regions being flexibly set with respect to one image (one frame image) and the like becomes possible.

Also, in one aspect of the invention, the error detection unit may perform the error detection based on the $i^{th}$ error detection data in the $i^{th}$ error detection region.

In this way, an error can be detected in each of a set plurality of error detection regions.

Also, in one aspect of the invention, the error detection unit may perform the error detection on the display image data based on the error detection data that is added on a front side of the display image data.

In this way, display image data and error detection data used to perform error detection on the display image data can be included in image data of the same frame and the like, and therefore effective data communication and error detection are enabled.

Also, in one aspect of the invention, the circuit device further includes an error determination information output unit. The error detection unit may perform the error detection by computing error detection codes in a plurality of error detection regions of the image data, and the error determination information output unit may output error determination information with respect to the plurality of error detection regions based on the error detection code in the plurality of frames.

In this way, error determination based on time series error detection codes is performed, and therefore flexible error determination can be performed according to a situation.

Also, in one aspect of the invention, the error determination information output unit may output first error determination information as the error determination information based on a result of comparison between the error detection code in a $j^{th}$ frame (j is an integer of one or more) and the error detection code in a $(j+1)^{th}$ frame.

In this way, error determination information can be output based on whether or not the error detection codes in different frames match.

Also, in one aspect of the invention, the error determination information output unit may output second error determination information as the error determination information when an integrated value of the number of error detection times based on the error detection code reaches a given number of times.

In this way, error determination information can be output based on an integrated value of the error detection number of times.

Also, in one aspect of the invention, the error determination information output unit may output third error determination information as the error determination information when an error is detected based on the error detection code in each of a successive given number of set frames.

In this way, error determination information can be output based on the number of successive error detections.

Also, in one aspect of the invention, the circuit device further includes a control unit that performs operation control on the circuit device. The error determination information output unit may output a plurality of pieces of error determination information whose determination processing with respect to the error detection code is different to each other as the error determination information, and the control unit may perform the operation control based on at least one of the error detection regions in which an error has been determined, out of the plurality of error detection regions, and the error determination information that has been output, out of the plurality of pieces of error determination information.

In this way, appropriate operations can be executed according to the error detection region in which an error has been determined, or the error determination information that has been output.

Also, in one aspect of the invention, a $j^{th}$ frame error detection region and a $k^{th}$ frame error detection region may be set such that the number of regions in the $j^{th}$ frame error detection region and the number of regions in the $k^{th}$ frame error detection region are different.

According to one aspect of the invention, a plurality of error detection regions are set as the error detection region for each frame, or a different number of error detection regions are set as the error detection region for each frame. Accordingly, flexible setting of error detection regions such as setting appropriate error detection regions according to the content of a display image becomes possible.

Also, another aspect of the invention relates to an electro-optical device including the circuit device according to any of the above descriptions; and an electro-optical panel.

Also, another aspect of the invention relates to an electronic apparatus including the circuit device according to any of the above descriptions.

Also, another aspect of the invention relates to a mobile body including the circuit device according to any of the above descriptions.

Also, another aspect of the invention relates to an error detection method including: receiving image data including display image data and error detection data that includes at least position information regarding an error detection region; and performing error detection on the display image data based on the display image data of the error detection region that is specified by the position information.

BRIEF DESCRIPTION OF DRAWINGS

FIG. 6 shows an exemplary data structure when error detection data is included in image data.

DESCRIPTION OF EMBODIMENTS

The following is a detailed description of preferred embodiments of the invention. Note that the embodiments described below are not intended to unduly limit the content of the invention recited in the claims, and all of the configurations described in the embodiments are not necessarily essential as solutions provided by the invention.

1. Circuit Device

Figure 1:
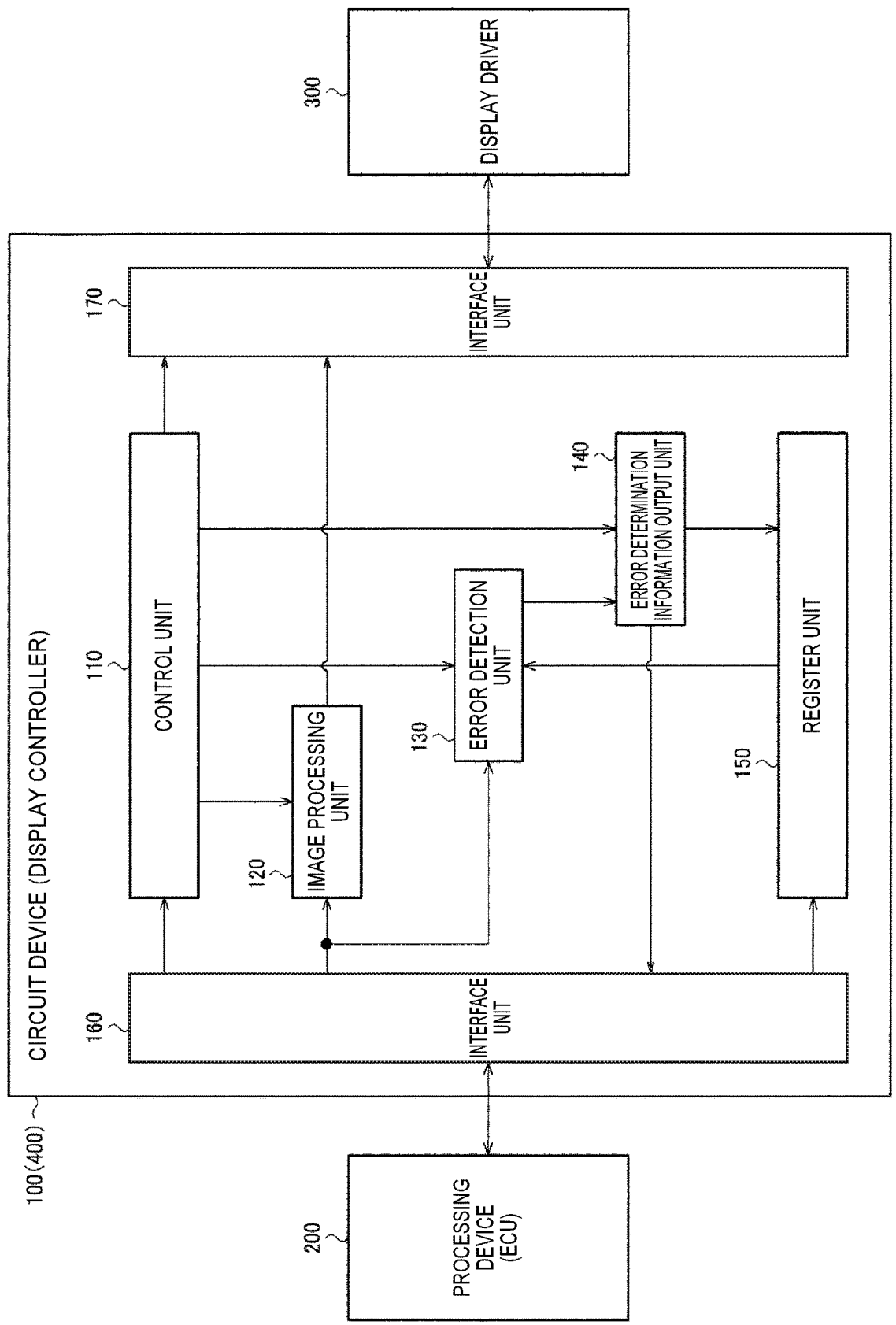
FIG. 1 shows an exemplary configuration of a circuit device.

An exemplary configuration of a circuit device 100 (display controller 400) of the present embodiment is shown in FIG. 1. The circuit device 100 includes a control unit 110 (control circuit), an image processing unit 120 (image processing circuit), an error detection unit 130 (error detection circuit), an error determination information output unit 140 (error determination information output circuit), a register unit 150 (register), and interface units 160 and 170 (interface circuits). The circuit device 100 is realized by an integrated circuit device (IC), for example.

The interface unit 160 performs communication between a processing device 200 and the circuit device 100. For example, the interface unit 160 receives image data transmitted from the processing device 200 to the image processing unit 120, and receives timing control signals (such as a clock signal, vertical synchronizing signal, horizontal synchronizing signal, data enable signal, for example) that are transmitted from the processing device 200 to the control unit 110. Also, as will be described later using FIG. 11 and the like, writing to the register unit 150 may be performed by the processing device 200. In this case, the interface unit 160 receives a register value to be written to the register unit 150, from the processing device 200. Alternatively, the interface unit 160 transmits error determination information (error signal, error detection signal) that the error determination information output unit 140 outputs to the processing device 200, and transmits a register value that the processing device 200 reads out from the register unit 150.

An LVDS (Low Voltage Differential Signal) method, an RGB serial method, and a transmission method of the display port standard can be adopted as the communication method of the image data and the timing control signal. An I2C method, a three-wire or four-wire serial transmission method, or the like can be adopted as the communication method of the error signal and the register value. The interface unit 160 is constituted by an input/output buffer circuit and a control circuit (such as PLL circuit in the LVDS method, for example) so as to realize such a communication method.

Note that, when the circuit device 100 is mounted on an automobile or the like, for example, the processing device 200 is an ECU (Electronic Control Unit). Alternatively, when the circuit device 100 is mounted on an electronic apparatus such as an information communication terminal, the processing device 200 is a processor such as a CPU (Central Processing Unit) or a microprocessor.

The processing device 200 transmits error detection data including position information regarding the error detection region and a CRC expectation value (expectation value information for error detection) with respect to the error detection region to the circuit device 100 (display controller 400). Specifically, as will be described using FIGS. 5 and 6, the processing device 200 transmits display image data to be used for actual display and error detection data as the image data. In other words, the processing device 200 transmits the error detection data via an interface (such as above-described LVDS method or RGB serial method) for transmitting image data, of the interface unit 160. Alternatively, as will be described later using FIG. 11 and the like, the processing device 200 may also write the error detection data into the register unit 150 via a register value interface (such as I2C method).

The control unit 110 controls the units of the circuit device 100. Specifically, the control unit 110 may perform timing control, and controls the units of the circuit device 100 and generates timing control signals (such as a clock signal, vertical synchronizing signal, horizontal synchronizing signal, and data enable signal) to be transmitted to a display driver 300, based on a timing control signal from the processing device 200.

The image processing unit 120 performs various types of image processing (such as tone correction, for example) and data formatting processing (processing for generating transmission data that conforms to the data reception method of the driver 300) on the image data (display data) from the processing device 200.

The error detection unit 130 performs error detection processing on the image data from the processing device 200. In the following, a case where the error detection unit 130 performs the error detection processing using a CRC (Cyclic Redundancy Check) will be described, as an example. Note that the method of error detection is not limited to the CRC, and a method such as checksum can be adopted, for example. A detailed exemplary configuration of the error detection unit 130 will be described later.

The error determination information output unit 140 outputs error determination information based on the output (a CRC value or a comparison result signal indicating a result of comparison between a CRC value and an expectation value) of the error detection unit 130. Outputting error determination information is to output error determination information (error signal) to the processing device 200, or to write the error determination information into the register unit 150, for example. The error signal here may be an interrupt request signal (IRQ: Interrupt ReQuest), for example. Alternatively, the error signal may be a signal (that is activated when an error has been determined) simply indicating that an error has been determined.

As will be described later in FIG. 4, a plurality of error detection regions are set in an image, in the present embodiment. The error detection unit 130 performs error detection on the image data for each error detection region, and outputs a CRC value and a comparison result signal for each error detection region. Also, the error determination information output unit 140 performs error determination for the error detection regions based on the respective CRC values and the comparison result signals, and outputs respective pieces of error determination information. A detailed exemplary configuration of the error determination information output unit 140 will be described later.

The interface unit 170 performs communication between the circuit device 100 and the display driver 300. For example, the interface unit 170 transmits image data output by the image processing unit 120 to the display driver 300, and transmits the timing control signals output by the control unit 110 to the display driver 300. Also, the interface unit 170 may transmit a setting signal (mode setting signal, for example) for controlling the operation of the display driver 300 to the display driver 300. A similar communication method as that of the interface unit 160 can be adopted as the communication method.

Note that the display driver 300 is a circuit device that drives a display panel (electro-optical panel such as a liquid-crystal display panel or an electrophoretic display panel, for example). The display driver 300 is constituted by a data driver that drives a data line of the display panel, a scan driver that drives a scan line of the display panel, a control circuit that controls the data and scan drivers, and a power supply circuit that supplies a power supply voltage and a reference voltage to the units of the display driver 300, for example.

The above-described control unit 110, the image processing unit 120, the error detection unit 130, the error determination information output unit 140, and the register unit 150 are each constituted by a logic circuit (gate array in which gate circuits such as an AND circuit, an OR circuit, and an inverter circuit and functional circuits such as a flip-flop circuit are placed, for example). These units each represent a functional block, and may be implemented as an integrated logic circuit, or may be implemented as separate logic circuits, as hardware.

Alternatively, each above-mentioned unit may be realized by software. That is, the processing of the circuit device 100 and the like of the present embodiment may be partly or mostly realized by a program. In this case, the circuit device 100 and the like of the present embodiment are realized by a processor such as a CPU executing a program. Specifically, a program stored in a non-transitory information storage medium is read out, and a processor such as a CPU executes the read-out program. Here, the information storage medium (computer readable medium) is a medium that stores a program, data, and the like, and the function thereof can be realized by an optical disk (such as DVD or CD), an HDD (hard disk drive), a memory (such as card-type memory or ROM), or the like. A processor such as a CPU performs various types of processing of the present embodiment based on a program (data) stored in the information storage medium. That is, a program (program for causing the computer to execute processing for each unit) for causing a computer (device including an operation unit, a processing unit, a storage unit, and an output unit) to function as each unit of the present embodiment is stored in the information storage medium.

Note that an example in which the circuit device 100 according to the present embodiment is realized by the display controller 400 (included in the display controller 400) has been described in the above, but is not limited thereto. For example, as shown in FIG. 2, the circuit device 100 of the present embodiment may be realized by the display driver 300.

The display driver 300 includes an interface unit 161, an error detection unit 131, an error determination information output unit 141, a register unit 151, a control unit (control circuit) 181, and a drive unit (drive circuit) 191. The interface unit 161, the error detection unit 131, the error determination information output unit 141, and the register unit 151 are respectively realized by similar configurations of the interface unit 160, the error detection unit 130, the error determination information output unit 140, and the register unit 150 shown in FIG. 1. Also, the drive unit 191 corresponds to the above-described data driver and scan driver.

Figure 2:
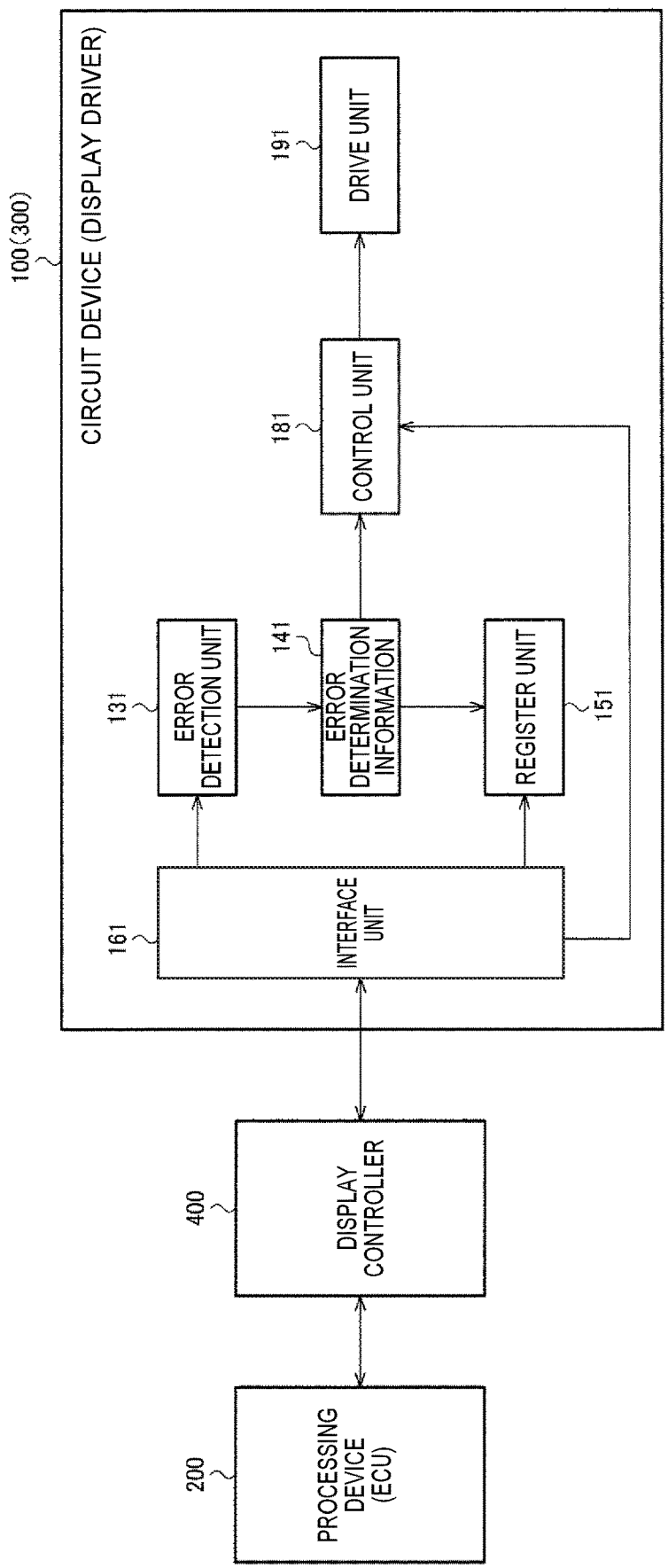
FIG. 2 shows another exemplary configuration of the circuit device.

As shown in FIGS. 1 and 2, image data is also communicated between the display controller 400 (interface unit 170, in a narrow sense) and the display driver 300 (interface unit 161, in a narrow sense). Therefore, as a result of realizing the circuit device 100 as the display driver 300, an error in the communication between the display controller 400 and the display driver 300 can be determined.

Figure 3:
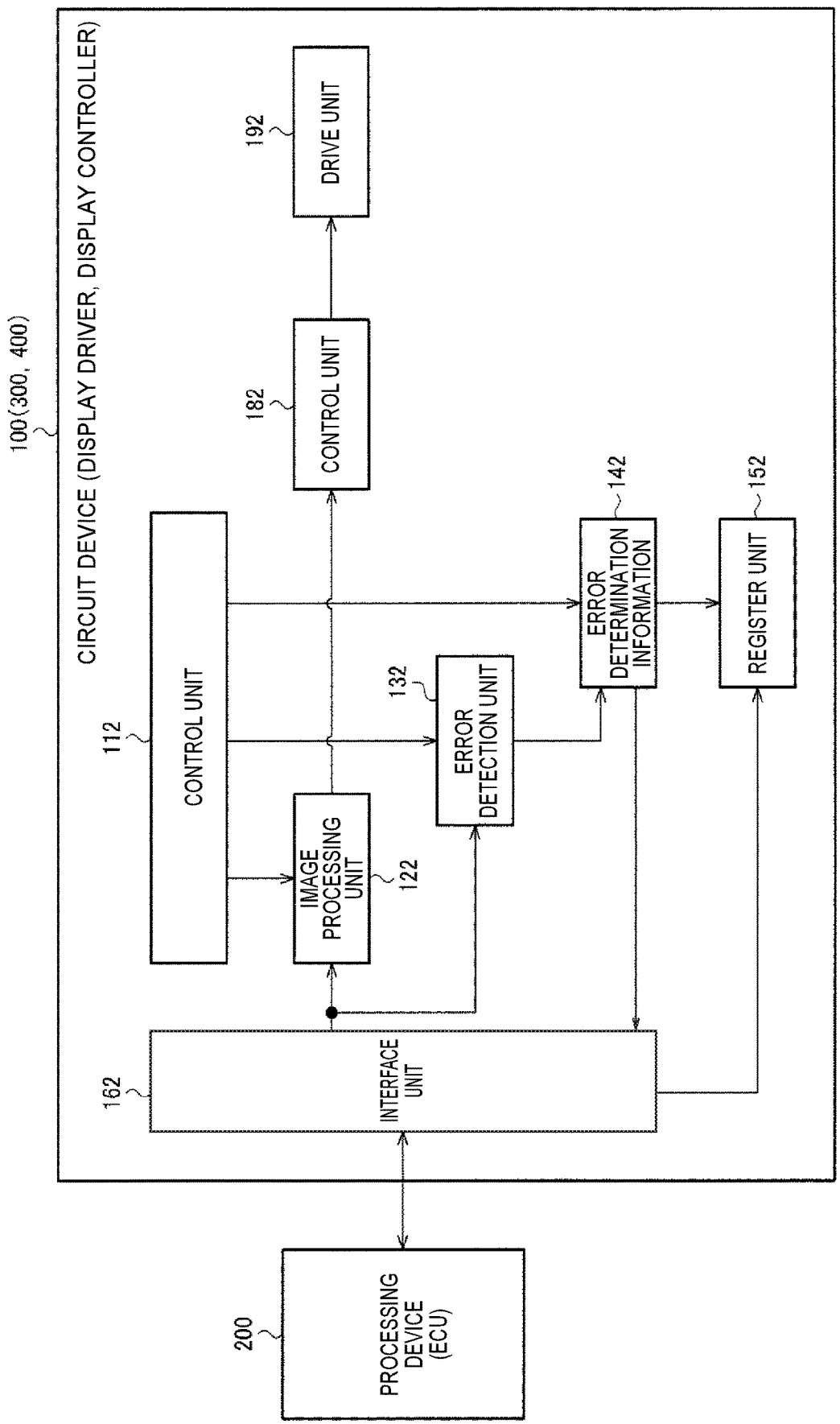
FIG. 3 shows another exemplary configuration of the circuit device.

Also, an example in which the display controller 400 and the display driver 300 are implemented as different ICs is shown in FIGS. 1 and 2. In contrast, as shown in FIG. 3, the display controller 400 and the display driver 300 may be implemented as a one-chip IC. The circuit device 100 in this case includes a control unit 112, an image processing unit 122, an error detection unit 132, an error determination information output unit 142, a register unit 152, an interface unit 162, a control unit 182, and a drive unit 192, as shown in FIG. 3. The units of the circuit device 100 are similarly configured as those in FIG. 1 or 2. Note that, in FIG. 3, the control unit 112 for the display controller 400 and the control unit 182 for the display driver 300 are separately described, but these control units may be combined into one control unit.

In the example in FIG. 3, communication need not be performed between the display controller 400 and the display driver 300, and therefore an error in communication between the processing device 200 and the circuit device 100 need only be determined.

In the following, an example in which the circuit device 100 is realized as the display controller 400, as shown in FIG. 1, will be described, but the following description can be extended and applied to a case where the circuit device 100 is realized as another device, as in FIGS. 2 and 3.

2. Exemplary Setting of Error Detection Region

Figure 4:
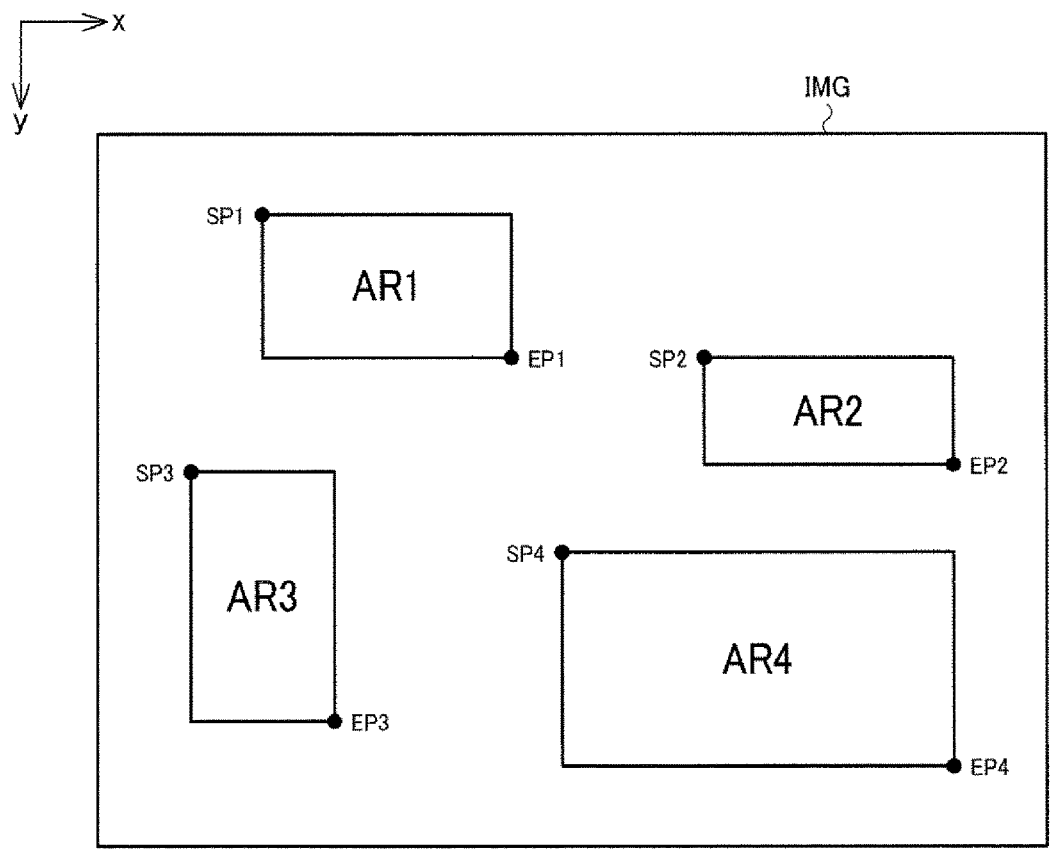
FIG. 4 shows an exemplary setting of an error detection region.

An exemplary setting of the error detection region is shown in FIG. 4. In FIG. 4, first to fourth error detection regions AR1 to AR4 are set in an image IMG of a given frame. The size (width and height) of each error detection region is smaller than the size of the image IMG. That is, an error is not detected in the entire region of the image IMG, but is detected in a portion of the image IMG, namely the error detection regions AR1 to AR4.

The error detection regions AR1 to AR4 are respectively designated by start points SP1 to SP4 and end points EP1 to EP4. Specifically, as a result of acquiring the coordinates of the start points SP1 to SP4 and the coordinates of the end points EP1 to EP4 as position information, the error detection regions AR1 to AR4 are designated. For example, a coordinate x in a horizontal scan direction and a coordinate y in a vertical scan direction are defined using the coordinates of the upper left pixel of the image IMG as the origin, for example. The pixel having the smallest coordinate x and the smallest coordinate y is the start point and the pixel having the largest coordinate x and the largest coordinate y is the end point.

In FIG. 4, the processing device 200 calculates CRC values for the respective error detection regions AR1 to AR4, and the CRC values are transmitted to the circuit device 100 as the expectation values. Also, the error detection unit 130 calculates CRC values for the respective error detection regions AR1 to AR4, and compares the calculated values and the respective expectation values.

Note that the number of error detection regions is not limited to four, and any number of two or more error detection regions can be set. Also, in FIG. 4, the error detection regions AR1 to AR4 do not overlap each other, but there is no limit to this, and they may be partially overlapped regions. Also, the position information that designates each error detection region is not limited to the start point and the end point, and may be any information with which the region can be determined. For example, the position information may be the coordinates of the start point, the width (number of pixels in the horizontal scan direction), and the height (number of pixels in the vertical scan direction) of the error detection region.

As described above, an error is detected not in the entire image, but in the error detection regions, which is a portion of the image. Accordingly, the amount of data used when the processing device 200 calculates the CRC values is reduced, and the processing load of the processing device 200 can be reduced. Also, as a result of setting a plurality of error detection regions, an error can be detected in a wider region of the image, and the occurrence of detection failures of an error can be reduced. If the error detection region is set to a particularly important region, effective error detection can be performed.

Also, the error detection regions in a given one frame are shown in FIG. 4, but the setting of the error detection regions can be changed frame by frame. That is, in the present embodiment, the number, position, size, shape of the error detection regions can be variably set for each frame. In other words, in an $i^{th}$ frame image, an error is detected in an $i^{th}$ frame error detection region, in a $j^{th}$ frame image, an error is detected in a $j^{th}$ frame error detection region, and the positions of the error detection regions for the $i^{th}$ and $j^{th}$ frames are different. Note that n is an integer of two or more, i and j are integers of one or more and n or less, and i ≠ j. Accordingly, an error can be detected in the error detection region set at a different position in each frame, and as a result, an error can be detected in a wider range in the image. Also, since an error is detected in a region that is smaller than the entire image, the processing load of the processing device 200 can be reduced.

Here, the detecting of an error is to check whether or not the image data that the processing device 200 transmitted to the circuit device 100 matches the image data that the circuit device 100 has actually received (detection of a communication error). Also, the frame image is an image (or an image to be displayed) that is displayed in one frame. For example, when the display in the display panel is updated at a rate of 30 fps (frames per second), the period of one frame is ⅟₃₀ seconds, and an image rendered in one frame is the frame image. Note that the frame image, here, is an image at a stage when the processing device 200 transmits to the circuit device 100. That is, the finally displayed frame image is not necessarily the same as the frame image on which the error detection is performed, because image processing may be performed therebetween.

3. Example of Data Reception Method

Next, a method with which display image data and error detection data are received from the processing device 200 will be described. Note that, as will be described later using FIG. 11 and the like, different modifications can be implemented with respect to a method with which the display image data is received and a method with which the error detection data is received.

As shown in FIG. 1, the circuit device 100 according to the present embodiment includes the interface unit 160 that receives image data and the error detection unit 130 that performs error detection. Note that, as described above, the interface unit 160 includes the interface (an RGB method, etc.) for image data and the interface (an I2C method or a three-wire or four-wire serial transmission method, etc.) for error signal and register value, but the interface unit 160 here is an interface for image data, in a narrow sense.

Also, the interface unit 160 receives image data including display image data and error detection data that includes at least position information regarding the error detection region, and the error detection unit 130 performs error detection on the display image data based on the display image data of the error detection region specified by the position information.

In this way, error detection data can be included in the image data. In other words, the circuit device 100 of the present embodiment can receive the error detection data using the interface for receiving the display image data.

Figure 5:
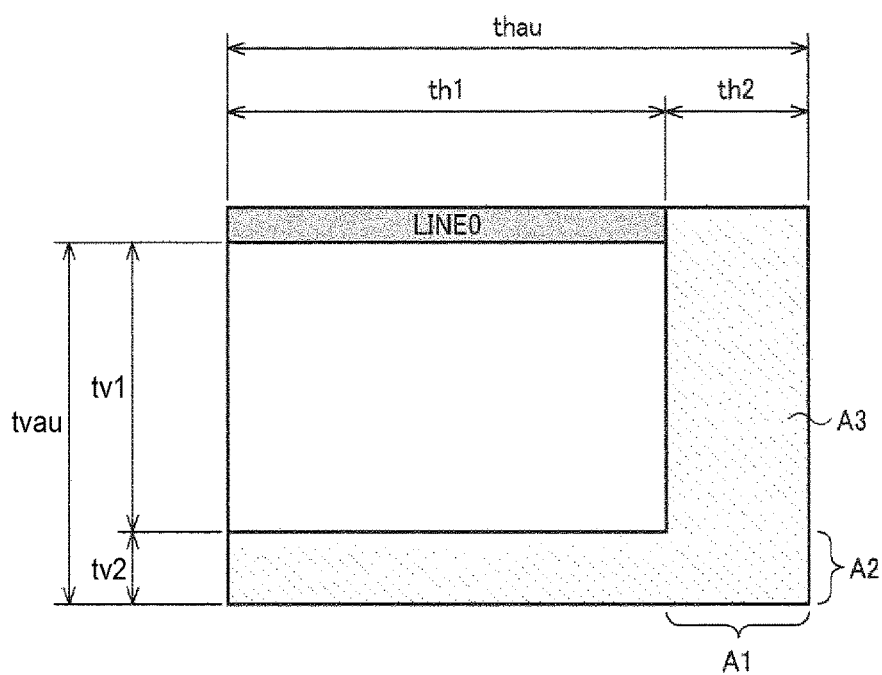
FIG. 5 is a schematic diagram for describing an image region.

FIG. 5 is a schematic diagram of an image region (including a display region and a non-display region) corresponding to the image data of the present embodiment. th1 in FIG. 5 indicates the number of pixels (size) of an effective image area (display region) in a horizontal direction, and tv1 indicates the number of pixels of the effective image area in a vertical direction. In the example in FIG. 5, the area (total number of pixels) of the effective image area, that is, the size of an image to be displayed is th1×tv1.

For example, in an example in which 8 bits are assigned to each of R, G, and B data for each pixel, 24-bit data for one pixel may be used. In the present embodiment, the image data to be used for actual display is referred to as display image data. The display image data is data in the effective image area, and is data including th1×tv1×24 bits in the above example.

Also, when image data is displayed, a horizontal flyback period is provided, which is a period from when one line of data in the horizontal direction is displayed until display of the next one line of data is started. A1 in FIG. 5 illustrates a region corresponding to the horizontal flyback period for the sake of convenience, and th2 represents the number of pixels is the region. Also, when image data is displayed, a vertical flyback period is provided, which is a period from when an image of one frame is displayed until display of an image of the next frame is started. A2 in FIG. 5 illustrates a region corresponding to the vertical flyback period for the sake of convenience, and tv2 represents the number of pixels in the region. A region A3 determined by A1 and A2 is a non-display region that is not used for image display.

As described above, the data in the effective image area is the display image data, and therefore it is not preferable that error detection data is included in the effective image area. This is because an image cannot be displayed in the effective image area if error detection data is written into the data thereof.

On the other hand, the error detection data may be added to data in the non-display region. The non-display region corresponds to the flyback period, and therefore addition of data to the data in the non-display region does not interfere with the transmission and reception of display image data. Note that a case where adding error detection data to the data in the non-display region is difficult is conceivable depending on the communication standard.

Therefore, in the present embodiment, the interface unit 160 receives image data in which error detection data is added on a front side of the display image data, as shown by LINE0 in FIG. 5. In this way, the error detection data can be appropriately received without interfering with the reception of display image data.

In the example in FIG. 5, data for a line in the horizontal direction, th1×24 bits of data, for example, can be included in LINE0.

FIG. 6 shows an example of a data format of LINE0. The error detection data includes expectation value information used for the error detection. Specifically, the interface unit 160 receives image data including error detection data that includes position information regarding the error detection region and expectation value information used for the error detection. An example in which four error detection regions are set is envisioned in FIG. 6, and the error detection data includes four pieces of position information and expectation value information.

As described in FIG. 4, the position information includes coordinates of the start points SP1 to SP4 (coordinates of pixels corresponding to the start points) and coordinates of the end points EP1 to EP4 (coordinates of pixels corresponding to the end points), for example. In this case, the error detection unit 130 sets the rectangle regions whose diagonal lines are lines connecting the respective start points and end points as the error detection regions. When the coordinates of the start point are denoted by (hs, vs) and the coordinates of the end point are denoted by (he, ve), the values of hs, vs, he, and ve need only represent information with which one pixel in the effective image area can be specified. For example, if the effective image area has a size of 1920×1080, 11-bit data may be used as values of the position information. Note that various modifications can be implemented with respect to the number of bits.

Also, the expectation value information is obtained by the processing device 200 on a transmission side, and the expectation value information for an $i^{th}$ frame error detection region, for example, is obtained by the processing device 200 from the display image data for the $i^{th}$ frame error detection region, of the display image data of the $i^{th}$ frame image. The expectation value information includes an expectation value crcr based on R data values of the pixels in the error detection region, and expectation value crcg based on G data values of the pixels in the error detection region, and an expectation value crcb based on B data values of the pixels in the error detection region. Here, crcr, crcg, and crcb are each 16-bit data, but various modifications can be implemented with respect to the number of bits as well. Note that the expectation value information in the present embodiment may be the expectation value itself, but is not limited thereto, and may be information based on which the expectation value (alternatively, information corresponding to the expectation value) can be calculated.

In the example in FIG. 6, the region from an $i^{th}$ pixel to an i+6-th pixel, of LINE0, corresponds to the position information and the expectation value information regarding the first error detection region. Specifically, a vertical coordinate value vs0 of the start point is stored using 11 bits out of 16 bits of R regions of the i and $(i+1)^{th}$ pixels. Similarly, a horizontal coordinate value hs0 of the start point is stored using 11 bits out of 16 bits of G regions of the i and $(i+1)^{th}$ pixels, a vertical coordinate value ve0 of the end point is stored using 11 bits of R regions of the i+2 and i+3-th pixels, and a horizontal coordinate value he0 of the end point is stored using 11 bits of G regions of the i+2 and i+3-th pixels. In the example in FIG. 6, B regions in the i to i+3 pixels are not used.

Also, an expectation value crcr0 based on the R data is stored using 16 bits of R regions of the i+4 and i+5-th pixels. Similarly, an expectation value crcg0 based on G data is stored using 16 bits of G regions of the i+4 and i+5-th pixels, and an expectation value crcb0 based on B data is stored using 16 bits of B regions of the i+4 and i+5-th pixels.

Similarly, with respect to the other error detection regions, i+6 to i+11 pixels correspond to the second error detection region, and i+12 to i+17 pixels correspond to the third error detection region, and i+18 to i+23 pixels correspond to the fourth error detection region.

Note that the error detection data needs only be in a format such that the circuit device 100 on the reception side can specify the position information and the expectation value information for each of the error detection regions, and the data format thereof is not limited to that shown in FIG. 6. For example, the order of the position information and the expectation value information regarding each of the error detection regions is not limited to the order shown in FIG. 6.

As shown in FIG. 6, the image data includes second to $n^{th}$ pieces of error detection data (n is an integer of two or more), and $i^{th}$ (i is an integer that satisfies $2 \le i \le n$) error detection data of the second to $n^{th}$ pieces of error detection data includes position information corresponding to an $i^{th}$ error detection region. For example, the interface unit 160 receives $i^{th}$ to $n^{th}$ pieces of error detection data that respectively correspond to $i^{th}$ to $n^{th}$ error detection regions (n is an integer of two or more) and include pieces of position information regarding the respective error detection regions. In the example in FIG. 6, n=4, and the error detection data includes four pieces of position information.

In this way, a plurality of error detection regions can be appropriately set for each frame. Note that a plurality of error detection regions need not be set for each frame, and a frame for which one error detection region is set may be included. Also, a frame for which the error detection region is not set, and as a result, the error detection (and error determination) is to be skipped may be included. In any case, in the method in FIGS. 5 and 6, since the circuit device 100 can receive error detection data for each frame using the image data, the error detection region can be flexibly set.

Figure 7:
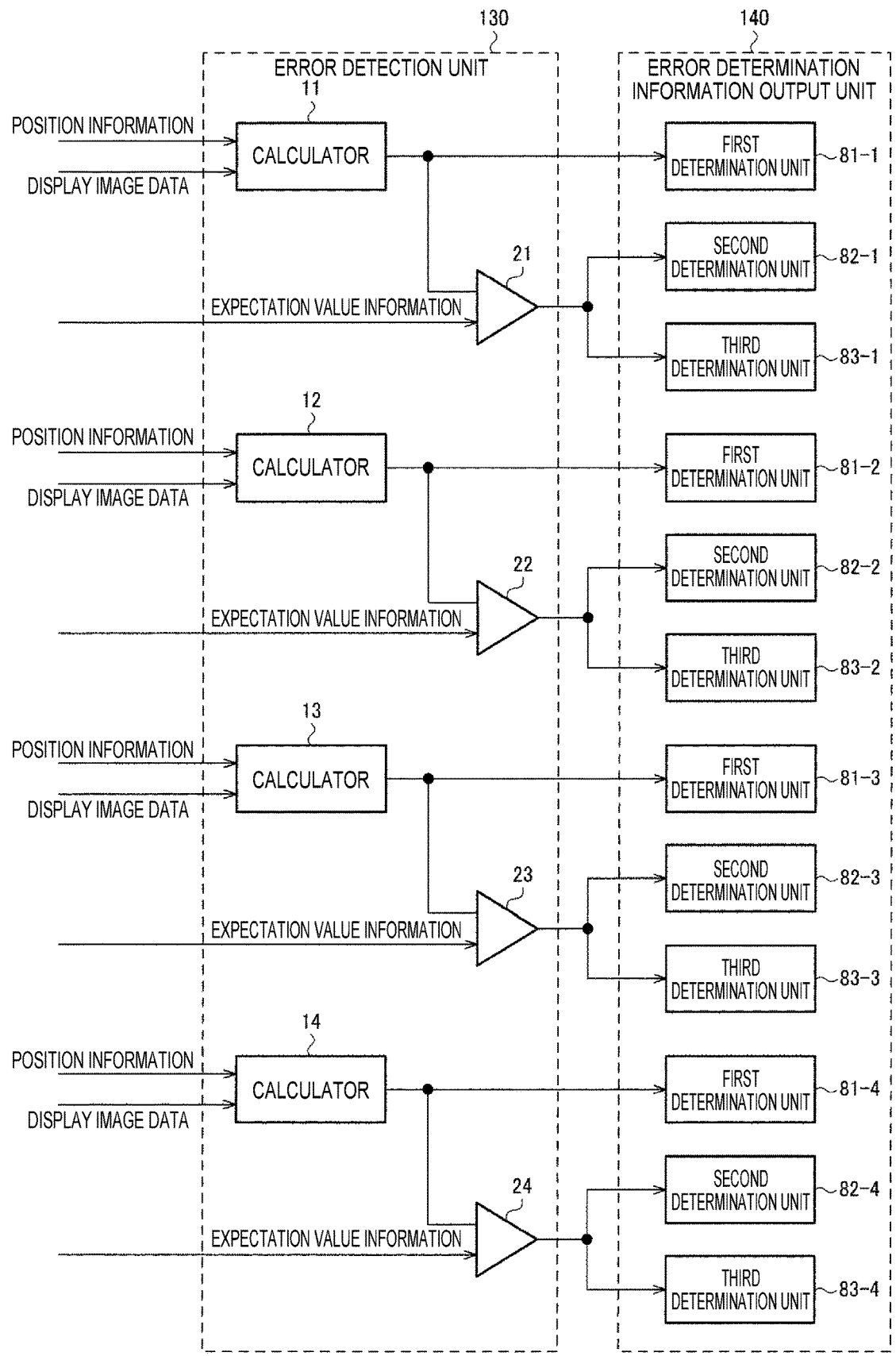
FIG. 7 shows a detailed exemplary configuration of an error detection unit and an error determination information output unit.

4. Details of Error Detection Unit and Error Determination Information Output Unit Detailed exemplary configuration of the error detection unit 130 and the error determination information output unit 140 is shown in FIG. 7. The error detection unit 130 includes calculators 11 to 14 (calculation circuits) and comparators 21 to 24 (comparison circuits). The error determination information output unit 140 includes first determination units 81-1 to 81-4, second determination units 82-1 to 82-4, and third determination units 83-1 to 83-4. Note that, here, a case in which four calculators and the like are included will be described as an example, but the number of calculators and the like may be any number of two or more (the same number as the maximum number of settable error detection regions, for example). In the following, the units of the error detection unit 130 and the error determination information output unit 140 will be described in detail.

4.1 Error Detection Unit

Position information regarding the first error detection region of the error detection data and display image data are input to the calculator 11. The calculator 11 calculates a CRC value (calculated value) based on display image data, of the display image data, in the first error detection region specified by the position information. In a broad sense, the calculator 11 calculates an error detection code of the image data. Various types of methods are widely known for the type and calculation method of the error detection code, and these can be widely applied in the present embodiment. The calculator 11 outputs the calculated CRC value to the comparator 21 and the first determination unit 81-1.

Expectation value information regarding the first error detection region of the error detection data and the CRC value calculated by the calculator 11 are input to the comparator 21. The CRC expectation value transmitted from the processing device 200 and the CRC value calculated by each of the calculators 11 to 14 include the same number of bits, and are calculated using the same computation expression. The comparator 21 performs comparison processing to determine whether or not the calculated CRC value matches the expectation value. That is, the error detection unit 130 performs error detection based on the expectation value information. The comparator 21 outputs a signal representing the comparison result (comparison result signal) to the second determination unit 82-1 and the third determination unit 83-1.

The calculators 12 to 14 and the comparators 22 to 24 similarly operate as the calculator 11 and the comparator 21, calculate CRC values of the corresponding error detection regions and perform comparison processing, and output the CRC values and the comparison result signals to the corresponding determination units of the error determination information output unit 140.

As shown in FIG. 7, in the case where the interface unit 160 receives $i^{th}$ to $n^{th}$ pieces of error detection data corresponding to the $i^{th}$ to $n^{th}$ error detection regions, the error detection unit 130 performs error detection in the respective error detection regions based on the respective pieces of error detection data. Specifically, the error detection unit 130 detects an error in the $i^{th}$ error detection region based on the $i^{th}$ error detection data. In the example in FIG. 7, n=4, and as a result of providing four calculators and comparators, the error detection can be executed in each error detection region.

In this way, even in a case where a plurality of error detection regions are set in one frame, an appropriate error detection can be executed for each error detection region as the target.

As shown in FIG. 7, the error detection unit 130 needs the error detection data (position information, expectation value information) and the display image data in order to perform error detection. Here, with respect to the display image data, the display image data for the entire image need not be acquired, and it is sufficient that the error detection unit 130 acquires display image data for an error detection region specified by the position information. That is, when display image data to be processed is received, sequential calculation (using pipeline processing) of the CRC value by the calculator 11 may be started. In this way, effective error detection can be performed.

In this case, which part of the display image data is the processing target cannot be specified without the position information. That is, the error detection data needs to be received at a timing before the display image data is received.

Therefore, it is preferable that the error detection unit 130 performs error detection on the display image data based on the error detection data that is added on a front side of the display image data. Here, "front side" means data received by the interface unit 160 at an earlier temporal timing. In the case where a two-dimensional image is envisioned, as shown in FIG. 5, and scanning is performed from an upper left side toward a lower right side, "front side" means an upper side in the image, and a left side in the same line.

In this way, when image data for one frame is received, the error detection data is received first, and thereafter the display image data is received. Therefore, the error detection data for performing the error detection on the display image data can be included in the image data for the same frame.

Note that the error detection data may be added on a back side of the display image data. In this case, the error detection data included in the image data for a given frame is used for the error detection to be performed on the display image data for the next frame. That is, the display image data and the error detection data corresponding to the display image data are included in pieces of image data for different frames.

Note that the interface unit 160 receives the display data used for display in an electro-optical panel from the processing device 200 as the image data, and the error detection unit 130 detects an error that occurs when the image data is transferred. Also, the error detection code used for the error detection is that of a cyclic redundancy check (CRC).

That is, the error detection performed by the circuit device 100 according to the present embodiment is specifically processing for checking whether or not, when the display image data is received, the received display image data is the same as the display image data that has been transmitted.

4.2 Error Determination Information Output Unit

The error detection unit 130 performs processing for comparing the CRC value with the expectation value. That is, when the comparison result indicates a mismatch, a communication error has occurred in the display image data. Therefore, the error determination information output unit 140 may output an error signal (interrupt request signal) to the processing device 200 when the comparison result signal indicates a mismatch.

Note that the frequency of occurrence of an error in communication is specified to some degree according to a communication standard, and a standard is conceivable in which the bit error rate is required to be less than or equal to $10^{-9}$. This is a probability that a data error will occur when one-bit data is transferred, and when the size of one frame image is th1×tv1 and the data size of one pixel is 24 bits, the probability that an error will occur per one frame is th1×tv×24×$10^{-9}$. Although the specific value depends on the image size, if the image includes 1920×1080 pixels, for example, it is possible that an error will occur once about every 20 frames. In this case, the interrupt request signal will be output 1.5 times per second if the frame rate is 30 fps, and three times per second if the frame rate is 60 fps. These values are excessively high as the frequency of occurrence of the interrupt processing, and it is possible that the processing device 200 will not operate smoothly. In the present embodiment, as a result of setting a region that is smaller than the entire image as the error detection region, the output frequency of the interrupt request signal (frequency of occurrence of the interrupt processing) can be reduced, but it is not sufficient.

Therefore, in the present embodiment, error determination may further be performed based on the output from the error detection unit 130. Specifically, the circuit device 100 includes the interface unit 160 that receives image data, the error detection unit 130 that performs error detection by calculating an error detection code for the image data, and the error determination information output unit 140 that outputs error determination information based on the error detection codes calculated for a plurality of frames.

In this way, the error determination information can be output based on the error detection codes calculated for a plurality of frames. Although a specific example will be described later, an error of higher importance, compared with a single error occurrence, such as a case where the number of error detections based on the error detection codes is large or a case where errors occur successively can be determined. Therefore, occurrence of an interruption at a high frequency as described above can be suppressed.

Also, the error detection unit 130 performs error detection by calculating error detection codes in a plurality of error detection regions of the image data, and the error determination information output unit 140 outputs error determination information for each of the plurality of error detection regions. That is, the error determination information can be output for each error detection region. Therefore, the content of the error determination can be adjusted according to the error detection region. For example, the settings for an important region are such that an error is easily determined so as to suppress the overlooking of an error. Alternatively, the settings for a less important region are such that an error is not easily determined so as to suppress excessive output of the interrupt request signal.

The error determination information output unit 140 may include the first determination units 81 (81-1 to 81-4), the second determination units 82 (82-1 to 82-4), and the third determination units 83 (83-1 to 83-4), as shown in FIG. 7. In the following, a detailed description will be given. Note that the configuration of each determination unit is not limited to the configuration described below, and various modifications can be implemented.

Figure 8:
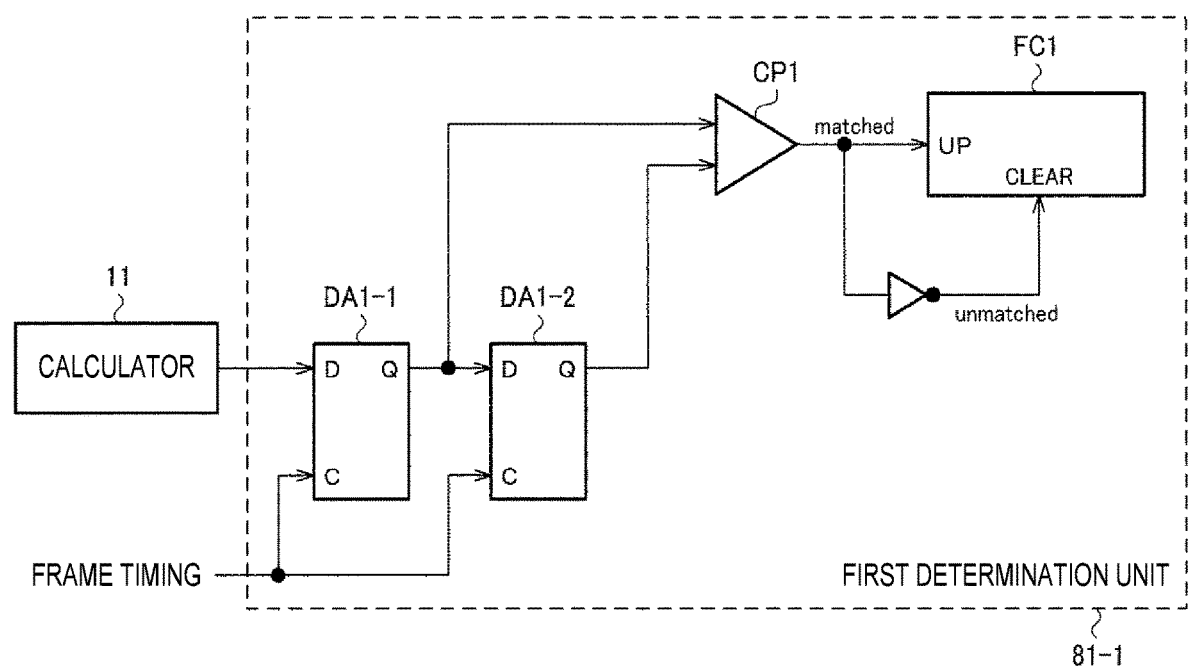
FIG. 8 shows an exemplary configuration of a first determination unit.

FIG. 8 shows an exemplary configuration of the first determination unit 81-1. Although a description will be omitted below, the first determination units 81-2 to 81-4 in FIG. 7 may be similarly configured. The first determination unit 81-1 includes delay circuits DA1-1 and DA1-2, a comparator CP1, and a frame counter FC1.

A CRC value from the calculator 11 is input to the delay circuit DA1-1, and the delay circuit DA1-1 delays the CRC value by a period of one frame. An output from the delay circuit DA1-1 is input to the delay circuit DA1-2, and the delay circuit DA1-2 further delays the output of the delay circuit DA1-1 by the period of one frame. The delay circuits DA1-1 and DA1-2 are each realized by a D flip-flop, for example. The comparator CP1 compares the output of the delay circuit DA1-1 with the output of the delay circuit DA1-2. In other words, the comparator CP1 determines whether or not the CRC value in a frame i matches the CRC value in a frame i+1, which is one frame after the frame i. The frame counter FC1 is a counter that performs count up or is reset based on the output of the comparator CP1.

The signal denoted by "matched" in FIG. 8 is a signal that is "1" (high level, activated) when the CRC values in frames i and i+1 match and "0" (low level, deactivated) when the CRC values do not match. The signal "unmatched" is a signal that is activated when the CRC values in frames i and i+1 do not match, and is deactivated when the CRC values match. The frame counter FC1 counts up (counter value is incremented) when the signal input to a terminal UP is activated, and is reset (counter value=0, for example) when the signal input to a terminal CLEAR is activated.

The error determination information output unit 140 outputs first error determination information as the error determination information based on the result of comparison between the error detection code at the $i^{th}$ frame and the error detection code at the $(i+1)^{th}$ frame by using the first determination unit 81-1 shown in FIG. 8.

The display image data may include, in many cases, a region in which the display content (pixel value) does not change. For example, in the case where the circuit device 100 is provided in a vehicle, a warning lamp for notifying a user of an abnormality in the vehicle may be displayed in a portion of the display panel. The warning lamp displays a first color pattern (a pattern in which all the warning lamp display region is green, for example) when there is no abnormality, and displays a second color pattern (entire region is red, for example) when there is an abnormality. In this way, the user is clearly notified of whether or not an abnormality has occurred.

The case where the warning lamp displays the second color pattern is a case where a serious abnormality has occurred to such a degree that the user is in danger, and therefore, most of the time, the warning lamp displays the first color pattern. As a result, in the case where a portion or the entirety of the display region of the warning lamp is set as the error detection region, the CRC value in the error detection region is constant in many cases. Also, a region in which continuation of a similar display is envisioned is conceivable other than the warning lamp, and if a region is set as the error detection region, the CRC value is expected to be the same over a long period of time.

That is, when an error detection region in which the CRC value being the same is envisioned is the target, it is possible to determine that, if the CRC value does not change (the same as that at the previous frame), a communication error has not occurred, and if the CRC value has changed, a communication error may have occurred.

For example, the first determination unit 81-1 checks the value of the frame counter FC1 at predetermined time intervals. If a communication error has not occurred, the count value of the frame counter FC1 is a value that is determined by the elapsed time (number of passed frames). On the other hand, if a communication error has occurred, since the frame counter FC1 is reset at a timing corresponding to the frame in which the communication error has occurred, the count value is smaller than the value when an error has not occurred. The first determination unit 81-1 determines whether or not a communication error has occurred based on the magnitude of the count value of the counter, and outputs the determination result as the first error determination information.

Figure 9:
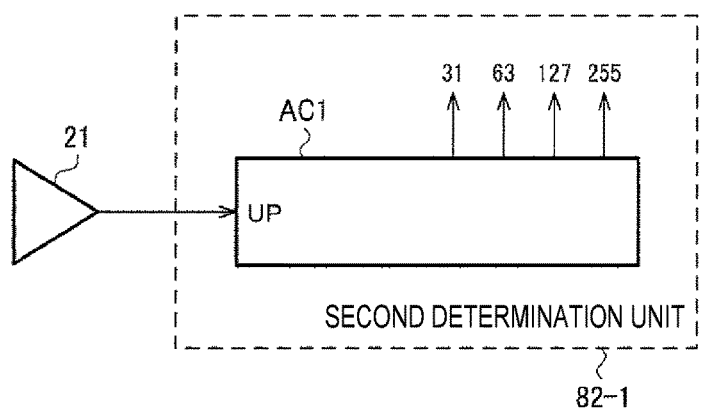
FIG. 9 shows an exemplary configuration of a second determination unit.

FIG. 9 shows an exemplary configuration of the second determination unit 82-1. Although the description will be omitted below, the second determination units 82-2 to 82-4 in FIG. 7 may be similarly configured. The second determination unit 82-1 is realized by an integration counter AC1.

The integration counter AC1 is a counter whose terminal UP receives an input of the comparison result signal from the comparator 21 of the error detection unit 130 and that counts up based on the comparison result signal. In FIG. 9, the comparison result signal is a signal that is "1" (activated) when the CRC value does not match the expectation value, and is "0" (deactivated) when the CRC value matches the expectation value. Note that the comparison result signal may be a signal that is activated when the CRC value matches the expectation value, and is deactivated when the CRC value does not match the expectation value. In this case, the second determination unit 82-1 includes an unshown inverter circuit (NOT circuit) for inverting the comparison result signal, and the inverted result may be input to the terminal UP of the integration counter AC1.

The integration counter AC1 counts up when the comparison result signal is activated, that is, when the CRC value does not match the expectation value. With this, in the integration counter AC1, the number of times the CRC value does not match the expectation value (number of times a CRC error has occurred) can be integrated. Also, the integration counter AC1 in which a predetermined threshold value is set determines that an error has occurred when the number of times the CRC error has occurred exceeds the threshold value. When the number of times the CRC error has occurred is large, it is considered that the severity of the error is high. That is, as a result of using the integration counter AC1, whether or not a severe communication error has occurred can be determined.

The error determination information output unit 140 outputs second error determination information as the error determination information, when the integrated value of the number of error detection times based on the error detection code has reached a given number of times by using the second determination unit 82-1 shown in FIG. 9. Note that the given number of times, here, can be variously set, and in the example in FIG. 9, one of four candidates, namely 31, 63, 127, 255 times, can be selected. For example, a relatively small value may be set to an important error detection region, and a relatively large value may be set to an error detection region that is less important. In this way, flexible error determination according to the degree of importance is possible.

Figure 10:
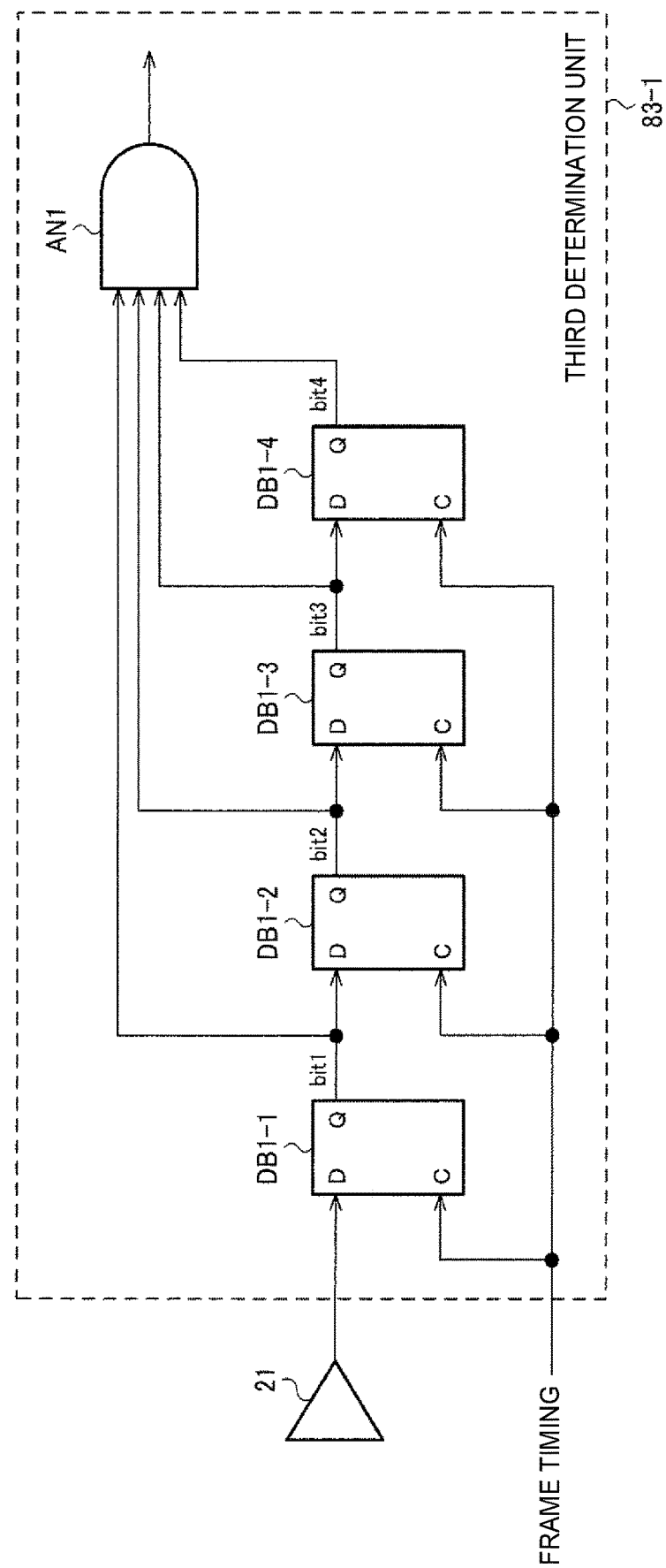
FIG. 10 shows an exemplary configuration of a third determination unit.

FIG. 10 shows an exemplary configuration of the third determination unit 83-1. Although the description will be omitted below, the third determination units 83-2 to 83-4 in FIG. 7 may be similarly configured. The third determination unit 83-1 includes first to fourth delay circuits (D flip-flops) DB1-1 to DB1-4, and an AND circuit AN1.

The comparison result signal from the comparator 21 of the error detection unit 130 is input to the first delay circuit DB1-1. Although an example in which the comparison result signal is activated when the CRC value does not match the expectation value, and is deactivated when the CRC value matches the expectation value is shown here, similarly to the above-described example, various modifications can be implemented. An output bit1 of the first delay circuit DB1-1 is input to the second delay circuit DB1-2. An output bit2 of the second delay circuit DB1-2 is input to the third delay circuit DB1-3. An output bit3 of the third delay circuit DB1-3 is input to the fourth delay circuit DB1-4. The outputs bit1 to bit3 and an output bit4 of the fourth delay circuit DB1-4 are input to the AND circuit AN1.

A signal corresponding to the frame timing of the image data is input to the delay circuits DB1-1 to DB1-4 as a clock signal. That is, the delay circuits DB1-1 to DB1-4 are each a circuit that delays a comparison result signal by one frame, and the outputs bit1 to bit4 represent comparison result signals at four different frames (four successive frames, in a narrow sense).

The AND circuit AN1 outputs a logical product of the outputs bit1 to bit4, and therefore the output of the AND circuit AN1 is activated when all of the outputs bit1 to bit4 are activated, that is, when the CRC value does not match the expectation value in each of the four successive frames. It is possible that a CRC error itself will occur several times per second, as described above, but it is not conceivable that a CRC error occurs in each of a plurality of successive frames in a normal state. Therefore, when a CRC error occurs in each of a plurality of successive frames, it can be determined that a serious communication error has occurred.

The error determination information output unit 140 outputs third error determination information as the error determination information when an error is detected based on the error detection code in each of a successive given number of set frames by using the third determination unit 83-1 shown in FIG. 10. Note that an example in which the given number of set frames is four is shown in FIG. 10, but there is no limitation thereto. For example, an unshown another AND circuit may be added to the configuration shown in FIG. 10. Specifically, a two-input AND circuit to which the outputs bit1 and bit2 are input and a three-input AND circuit to which outputs bit1 to bit3 are input may be added.

Under these circumstances, the third determination unit 83-1 is set such that the output thereof can be selected from the output bit1 itself, a logical product of the outputs bit1 and bit2, a logical product of the outputs bit1 to bit3, and a logical product of the outputs bit1 to bit4. In this way, the above-described given number of set frames can be selected from 1 to 4, and flexible error determination according to the degree of importance is possible. Also, a configuration in which five frames or more can be set as the number of set frames may be adopted. Note that, similarly to the second determination unit 82-1 described above, the number of set frames may be reduced as the importance of the error detection region increases.

Note that an example in which the first to third determination units are provided to each of the plurality of error detection regions are illustrated in FIG. 7, but there is no limitation thereto. For example, a modification in which the first determination unit 81 is not provided, or the first determination unit 81 is provided as a constituent element but does not operate (deactivated) in a given error detection region can be implemented.

Note that the output of the error determination information in the present embodiment can be realized using various methods. For example, as has been described above, the output of the error determination information may be an output of the interrupt request signal to the processing device 200. Alternatively, the output of the error determination information may be written into the register unit 150. In this case, the processing device 200 regularly reads a corresponding region of the register unit 150 so as to confirm the error occurrence status (polling).

In one example, the error determination information output unit 140 outputs the first error determination information from the above-described first determination unit 81 by writing to the register unit 150, and outputs the second error determination information from the second determination unit 82 and the third error determination information from the third determination unit 83 by outputting the interrupt request signal. Note that, in this example, the error determination information output unit 140 outputs the interrupt request signal based on eight determination results in the second determination units 82-1 to 82-4 and the third determination units 83-1 to 83-4. For example, the interrupt request signal may be output when an error is determined in any one of the second determination units 82-1 to 82-4 and the third determination units 83-1 to 83-4.

The operation performed by the processing device 200 upon receiving the interrupt request signal is envisioned in various ways. For example, the processing device 200 may stop transmission of image data to the circuit device 100, or the processing device 200 may instruct the circuit device 100 so as to perform specific display control (black display (entire screen is black) or display of a predetermined pattern, for example). Alternatively, the processing device 200 may stop operating the circuit device 100 or reset the circuit device 100.

Here, the operation of the processing device 200 may be changed according to the error detection region in which an error has been determined to have occurred, out of the plurality of error detection regions. Alternatively, the operation of the processing device 200 may be changed according to the error determination information that has been output, out of the plurality of pieces of error determination information (first to third error determination information, in the above-described example). As has been described above, in the present embodiment, the error detection region can be flexibly set, and there are cases where the importance or the like will be different region by region. Also, the contents of determination processing of the respective pieces of error determination information are different to each other, and therefore the error occurrence situation is different according to the type of determination in which an error has been determined. Therefore, as a result of specifying the error detection region and the content of the error determination information, the processing device 200 can appropriately deal with the error according to the region and the content of determination.

Also, an example in which the processing device 200 deals with an error when an error has been determined has been described above, but there is no limitation thereto. The circuit device 100 of the present embodiment further includes the control unit 110 that controls the operations of the circuit device, and the error determination information output unit 140 outputs a plurality of pieces of error determination information for which determination processing with respect to the error detection code is different to each other as the error determination information. Also, the control unit 110 of the circuit device 100 controls the operations based on at least one of the information that indicates the error detection region in which an error has been determined to have occurred, out of the plurality of error detection regions, and the information indicating which of the plurality of pieces of error determination information has been output.

That is, when an error has been determined, the circuit device 100 may execute operation control for handling the error. Various types of operation control are conceivable here, similarly to the example of the processing device 200, and may include stopping output of image data to an external unit (output from the display controller 400, which is the circuit device 100, to the display driver 300, for example), and specific display control such as displaying a black pattern, a specific pattern, or an image saved inside the circuit device 100.

Also, the method of the present embodiment can be applied to the circuit device 100 including the interface unit 160 that receives image data, a first error detection unit that performs error detection by calculating an error detection code of the image data in a first error detection region of the image data, and a second error detection unit that performs error detection by calculating an error detection code of the image data in a second error detection region of the image data.

Here, the first error detection unit corresponds to the calculator 11 and the comparator 21 in the error detection unit 130 shown in FIG. 7, and the second error detection unit corresponds to the calculator 12 and the comparator 22, for example.

Also, the circuit device 100 includes a first error determination information output unit that outputs error determination information based on an error detection code of the image data in a first frame and an error detection code of the image data in a second frame, which comes after the first frame, that have been output from the first error detection unit, and a second error determination information output unit that outputs error determination information based on an error detection code of the image data in a third frame and an error detection code of the image data in a fourth frame, which comes after the third frame, that have been output from the second error detection unit.

Here, the first error determination information output unit corresponds to the first determination unit 81-1, the second determination unit 82-1, and the third determination unit 83-1 in the error determination information output unit 140 in FIG. 7. The second error determination information output unit corresponds to the first determination unit 81-2, the second determination unit 82-2, and the third determination unit 83-2, for example.

In this way, a plurality of error detection regions can be set to an image, and error detection processing and processing for outputting error determination information can be performed for each error detection region. That is, according to the method of the present embodiment, error determination or the like using a plurality of frames can be independently performed for each error detection region (the error detection unit 130 independently outputs an output for each error detection region). For example, a region in which a warning lamp is displayed may be the first error detection region, and the other region may be the second error detection region. In this way, processing can be performed for each region according to the properties of an error detection region (degree of importance, in a narrow sense).

5. Another Example of Method of Receiving Error Detection Data

An example has been described above in which error detection data is included in image data, and the interface unit 160 receives the error detection data using an interface for image data. In this way, error detection data can be easily received in each frame without interfering with the reception of display image data, and it is not necessary to write error detection data into the register unit 150 or the like.

Note that the method of receiving the error detection data is not limited thereto. For example, the error detection data may be received using an interface that is different from the interface for image data. Also, the error detection may be performed by writing the received error detection data into the register unit 150. A detailed description will be given below.

Figure 11:
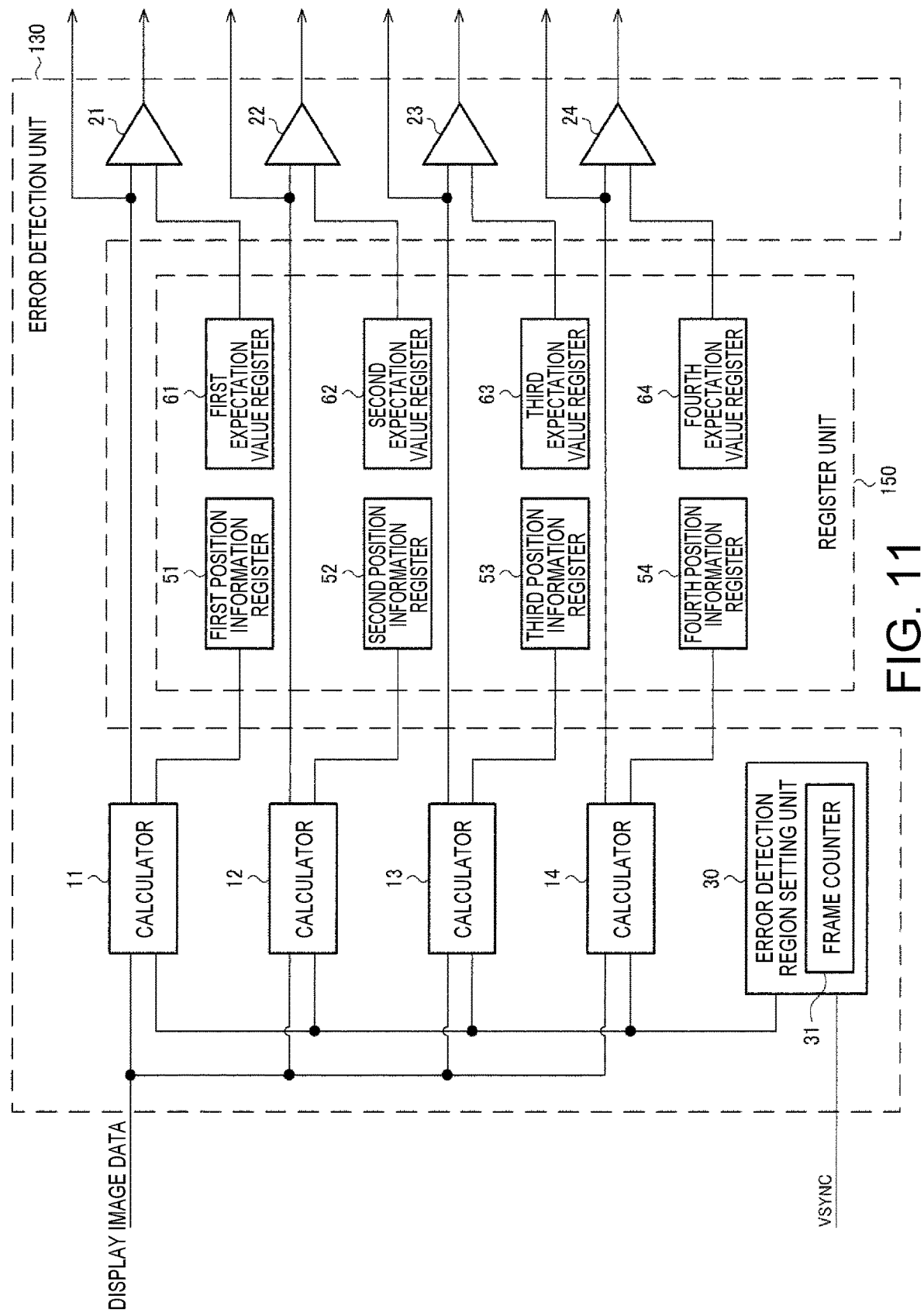
FIG. 11 shows another exemplary configuration of the error detection unit and a register unit.

A detailed exemplary configuration of the error detection unit 130 and the register unit 150 is shown in FIG. 11. The error detection unit 130 includes calculators 11 to 14, comparators 21 to 24, and an error detection region setting unit 30 (error detection region setting circuit). The calculators 11 to 14 and the comparators 21 to 24 are similarly configured to those in FIG. 7.

The register unit 150 includes first to fourth position information registers 51 to 54 and first to fourth expectation value registers 61 to 64. Note that the number of calculators and the like may be any number of two or more, similarly to the example shown in FIG. 7.

Pieces of position information regarding the first to fourth error detection regions are respectively written into the position information registers 51 to 54 from the processing device 200. CRC expectation values of the first to fourth error detection regions are respectively written into the expectation value registers 61 to 64 from the processing device 200.

For example, the position information and the expectation value information are written into the register unit 150 via an interface that is different from that for image data through I2C communication, three-wire or four-wire serial communication, or the like. Alternatively, the expectation value information may be written into the register unit 150 via the interface for image data.

The calculators 11 to 14 read out the position information from the respective position information registers 51 to 54, and calculate CRC values of the respective first to fourth error detection regions from the image data (display image data).

The comparators 21 to 24 respectively compare the CRC expectation values of the first to fourth error detection regions from the expectation value registers 61 to 64 and the CRC values of the first to fourth error detection regions from the calculators 11 to 14. The comparators 21 to 24 each output a signal "0" (low level, deactivated) when the expectation value matches the CRC value, as a comparison result signal, and output a signal "1" (high level, activated) when the expectation value does not match the CRC value, as the comparison result signal.

Figure 12:
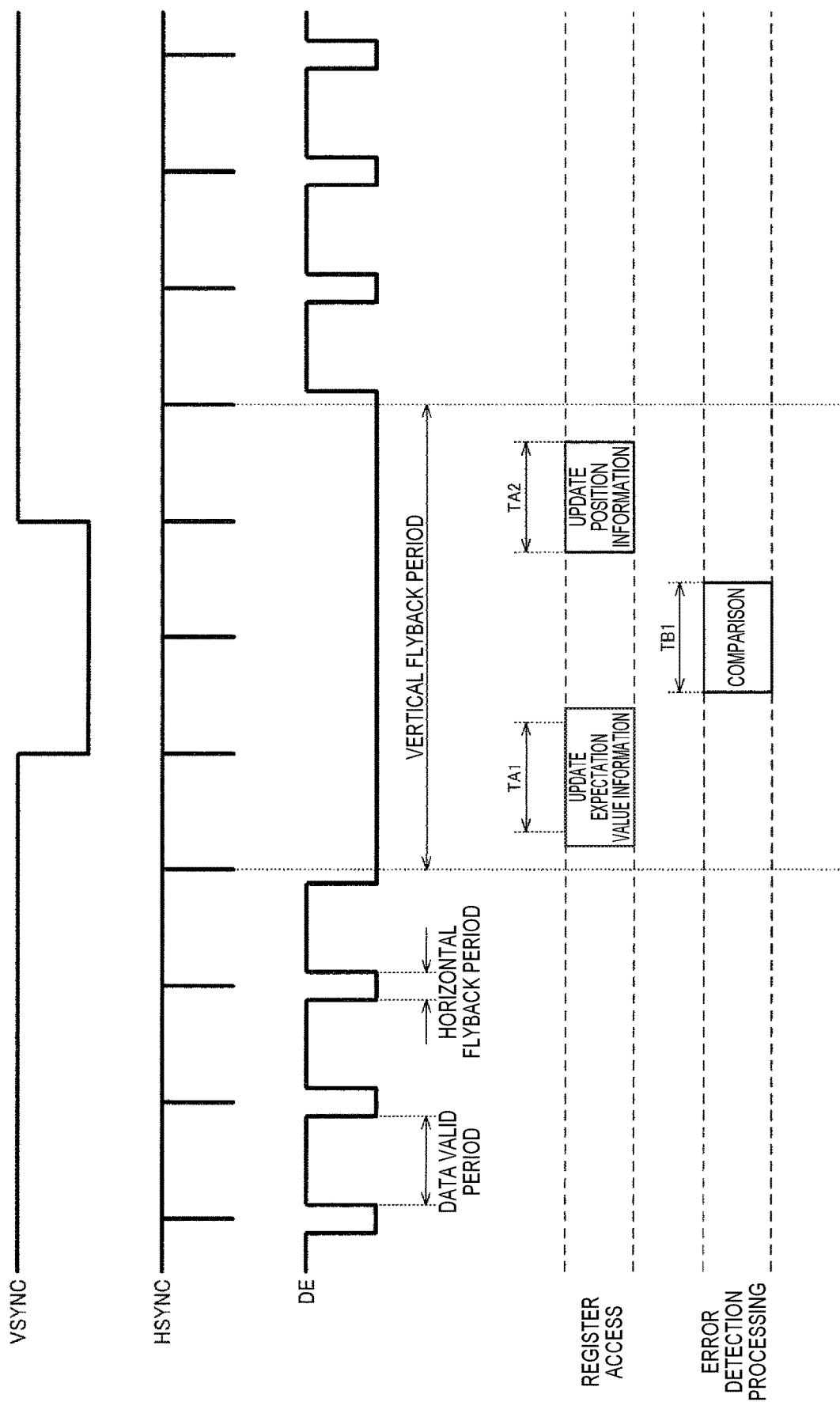
FIG. 12 is a timing chart of error detection processing.

A timing chart of the error detection processing is shown in FIG. 12. A vertical synchronizing signal VSYNC, a horizontal synchronizing signal HSYNC, and a data enable signal DE are supplied to the control unit 110 (timing control unit) of the circuit device 100 from the processing device 200. Note that instead of these signals being directly supplied from the processing device 200, the control unit 110 may generate these signals based on a synchronization signal supplied from the processing device 200.

The vertical synchronizing signal VSYNC is a signal for defining the vertical scan period (frame), and a period from a falling edge of the vertical synchronizing signal VSYNC to the next falling edge is one vertical scan period. Image data of one frame image is transmitted from the processing device 200 to the circuit device 100 in one vertical scan period.

The horizontal synchronizing signal HSYNC is a signal for defining the horizontal scan period, and a period from a falling edge of the horizontal synchronizing signal HSYNC to the next falling edge is one horizontal scan period. In one horizontal scan period, image data of one horizontal scan line is transmitted from the processing device 200 to the circuit device 100.

The data enable signal DE is activated (high level) in a portion (data valid period) of the horizontal scan period, and image data of a horizontal scan line is transmitted from the processing device 200 to the circuit device 100 in the activated period. A period between a data valid period and a data valid period is referred to as a horizontal flyback period, and image data is not transmitted in this period. Also, a vertical flyback period is provided when switching of the vertical scan period is performed, and the data enable signal DE is deactivated (low level) in the vertical flyback period. Image data is not transmitted in this period. In the example in FIG. 12, the vertical flyback period corresponds to four horizontal scan periods, and the vertical synchronizing signal VSYNC is at a low level in two horizontal scan periods thereof. Image data (display image data) of a frame image is transmitted in a period from when a vertical flyback period is ended until when the next vertical flyback period is started.

The error detection processing is executed in the above-described vertical flyback period. That is, the processing device 200 writes CRC expectation values to the expectation value registers 61 to 64 in a first register access period TA1 after a vertical flyback period has started. These expectation values are expectation values that are obtained from the image data that was transmitted in a frame immediately before the vertical flyback period. In an error detection period TB1 after the first register access period TA1, the comparators 21 to 24 compare the CRC values calculated in the calculators 11 to 14 and the respective expectation values. Note that the calculators 11 to 14 calculate CRC values from the image data that was transmitted in a frame immediately before the vertical flyback period. This calculation processing is successively performed following the input of image data (that is, not limited to be performed in the vertical flyback period), and is ended before the error detection period TB1. In a second register access period TA2 after the error detection period TB1, the processing device 200 writes position information regarding the error detection regions to the position information registers 51 to 54. This position information is position information regarding the error detection region to be applied to image data that is to be transmitted in a frame immediately after the vertical flyback period.

The processing after the CRC values and the comparison result signals have been obtained by the error detection unit 130 is similar to that of the example described above using FIG. 7. Alternatively, the error detection unit 130 may output the comparison result signals to the error determination information output unit 140 (error signal output unit), and the error determination information output unit 140 may output an error signal to the processing device 200 when a comparison result signal (detection signal) from the error detection unit 130 is activated. That is, the configuration of the error determination information output unit 140 may be simplified compared with that shown in FIGS. 7 to 10. In this case, the error detection unit 130 performs error detection on image data in each of the plurality of error detection regions, and outputs detection signals for the respective error detection regions (that is, outputs a plurality of detection signals). Also, the error signal output unit outputs an error signal when at least one of the plurality of detection signals is activated.

Note that, it is possible that, when the position information and the expectation value information are written into the register unit 150, pieces of the error detection data for a plurality of frames are collectively written into the register unit 150, and which piece of the position information is to be used is set by the error detection region setting unit 30.

The error detection region setting unit 30 sets (controls) which of the first to fourth error detection regions is to be the target of error detection. Specifically, the error detection region setting unit 30 includes a frame counter 31 that counts the vertical synchronizing signal VSYNC, and selects an error detection region that is the target of error detection according to the count value of the frame counter 31.

For example, a case is considered in which error detection information regarding four error detection regions are stored in the register unit 150 using the first to fourth position information registers 51 to 54 and the first to fourth expectation value registers 61 to 64, as shown in FIG. 11. In this case, four error detection regions AR1 to AR4 can be continuously set for each frame, as shown in FIG. 4 (hereinafter, referred to as "first method"). Note that, as a result of using information regarding the above-described four error detection regions, modifications such as second to fourth methods described below can be implemented.

Figure 13:
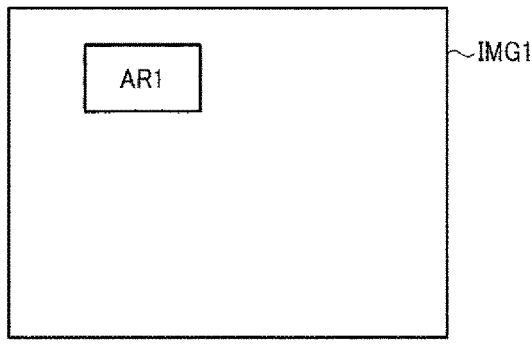
FIG. 13 shows an exemplary setting of the error detection region.
Figure 13:
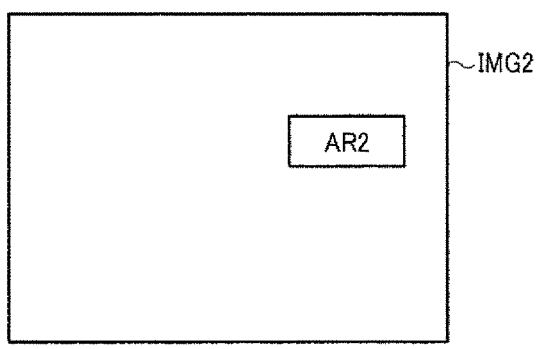
Figure 13:
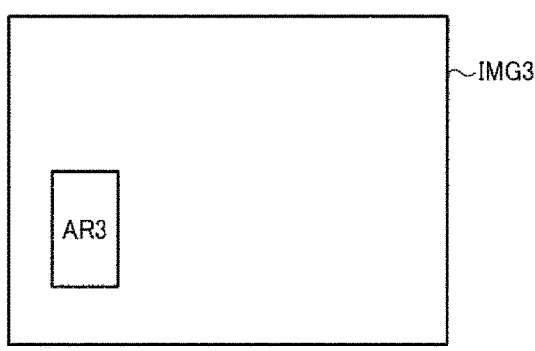
Figure 13:
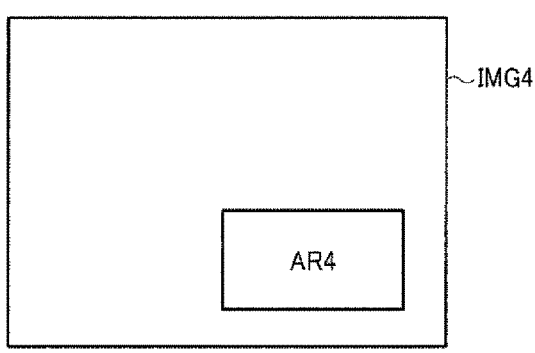

A diagram for describing the second method of error detection is shown in FIG. 13. In the second method, an error is detected in one error detection region with respect to one frame image. As shown in FIG. 13, an error is detected in a first error detection region AR1 of a frame image IMG1 in a first frame, an error is detected in a second error detection region AR2 of a frame image IMG2 in a second frame, an error is detected in a third error detection region AR3 of a frame image IMG3 in a third frame, and an error is detected in a fourth error detection region AR4 of a frame image IMG4 in a fourth frame. With respect to a fifth frame onward, similar operations are repeated.

For example, taking the first frame as an example, the processing device 200 calculates a CRC value in the error detection region AR1 in the frame image IMG1, and writes the CRC value into the register unit 150 as the expectation value. Also, the error detection unit 130 calculates a CRC value in the error detection region AR1 in the frame image IMG1, and compares the calculated value with the expectation value. The error signal output unit (error determination information output unit 140) outputs the interrupt request signal to the processing device 200 if the calculated value does not match the expectation value. In the second to fourth frames, similar error detection processing is performed on the second to fourth error detection regions AR2 to AR4. Note that the position information regarding each of the error detection regions AR1 to AR4 includes coordinates of start and end points, similarly to the first method.

The error detection region used in each frame is controlled as follows, for example. That is, the pieces of position information regarding the respective error detection regions AR1 to AR4 are collectively written into the register unit 150, and which of the pieces of position information regarding the respective error detection regions is to be used for each frame is controlled based on the output of the frame counter. Here, the processing device 200 writes a register value for designating which of the error detection regions is the target for each frame into the register unit 150, and the error detection unit 130 detects an error in the error detection region designated by the register value in each frame. Alternatively, the error detection unit 130 may detect an error in all of the error detection regions AR1 to AR4 in each frame, and the error signal output unit may validate (perform weighting) an error detection result with respect to the error detection region designated by the register value, and output the interrupt request signal based on only the validated error detection result.

According to the second method, an error is detected not in the entire image, but in an error detection region, which is a portion of the entire image, and a different error detection region is set for each frame. Accordingly, the amount of data that the processing device 200 uses to calculate the CRC value is reduced, and the processing load of the processing device 200 can be reduced. Also, as a result of setting a different error detection region in each frame, an error can be detected in a wider region of the image, and the occurrence of detection failures of an error can be reduced.

Figure 14:
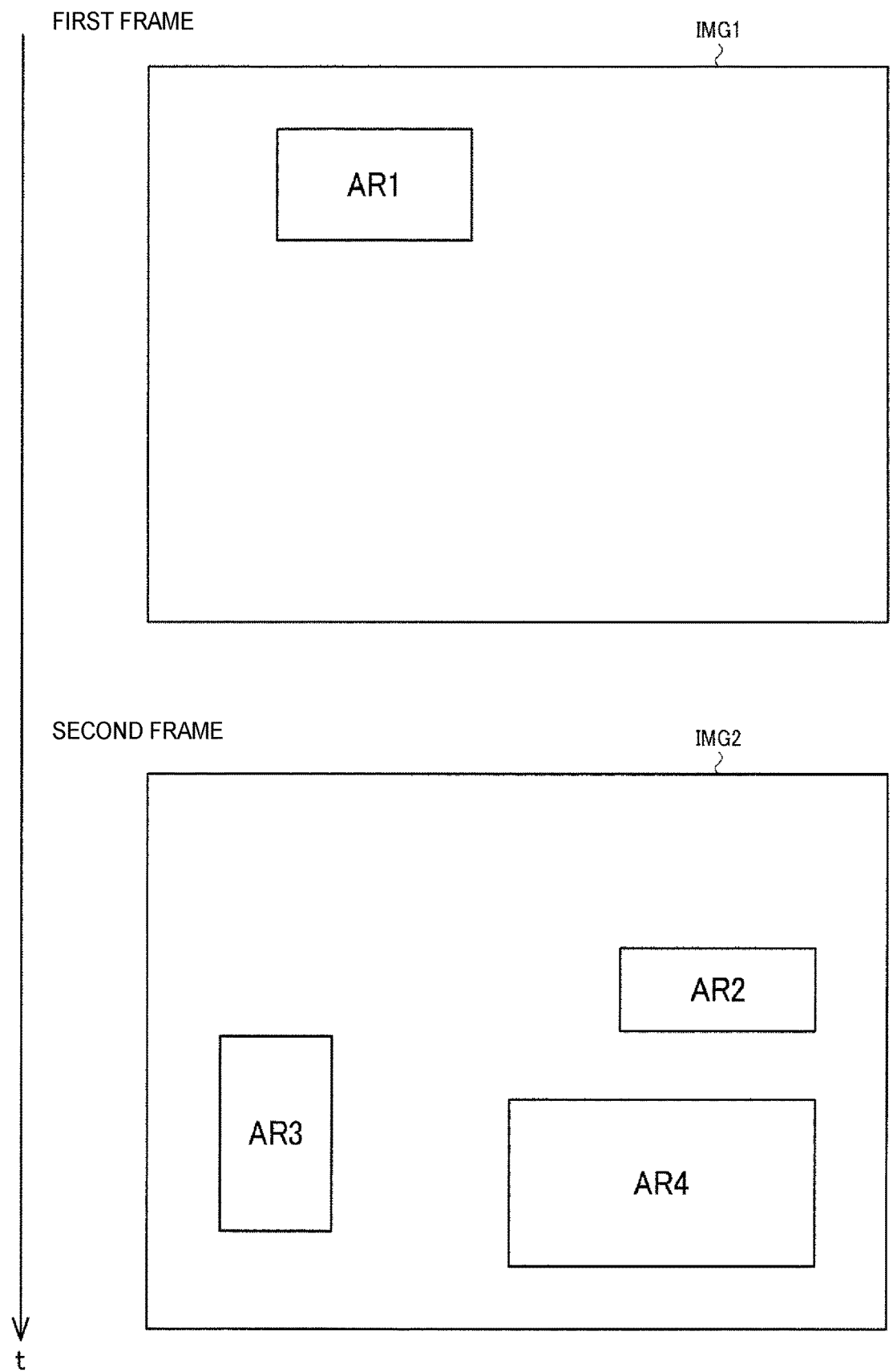
FIG. 14 shows an exemplary setting of the error detection region.

A diagram for describing the third method of error detection is shown in FIG. 14. In the third method, an error is detected in a different number of error detection regions between the frame image in a first frame and the frame image in a second frame. As shown in FIG. 14, an error is detected in a first error detection region AR1 of a frame image IMG1 in the first frame, and an error is detected in second to fourth error detection regions AR2 to AR4 of a frame image IMG2 in the second frame, for example. In the third frame onward, similar operations are repeated. Alternatively, the number of error detection regions may further be changed such as an error being detected in the first and second error detection regions AR1 and AR2 in the third frame, and an error being detected in the third and fourth error detection regions AR3 and AR4 in the fourth frame.

The position information regarding each of the error detection regions AR1 to AR4 includes coordinates of start and end points, similarly to the first method. Also, the error detection region used in each frame is controlled by a method similar to the second method.

According to the third method, the processing load of the processing device 200 can be reduced and an error can be detected in a wider region of the image, similarly to the second method.

Figure 15:
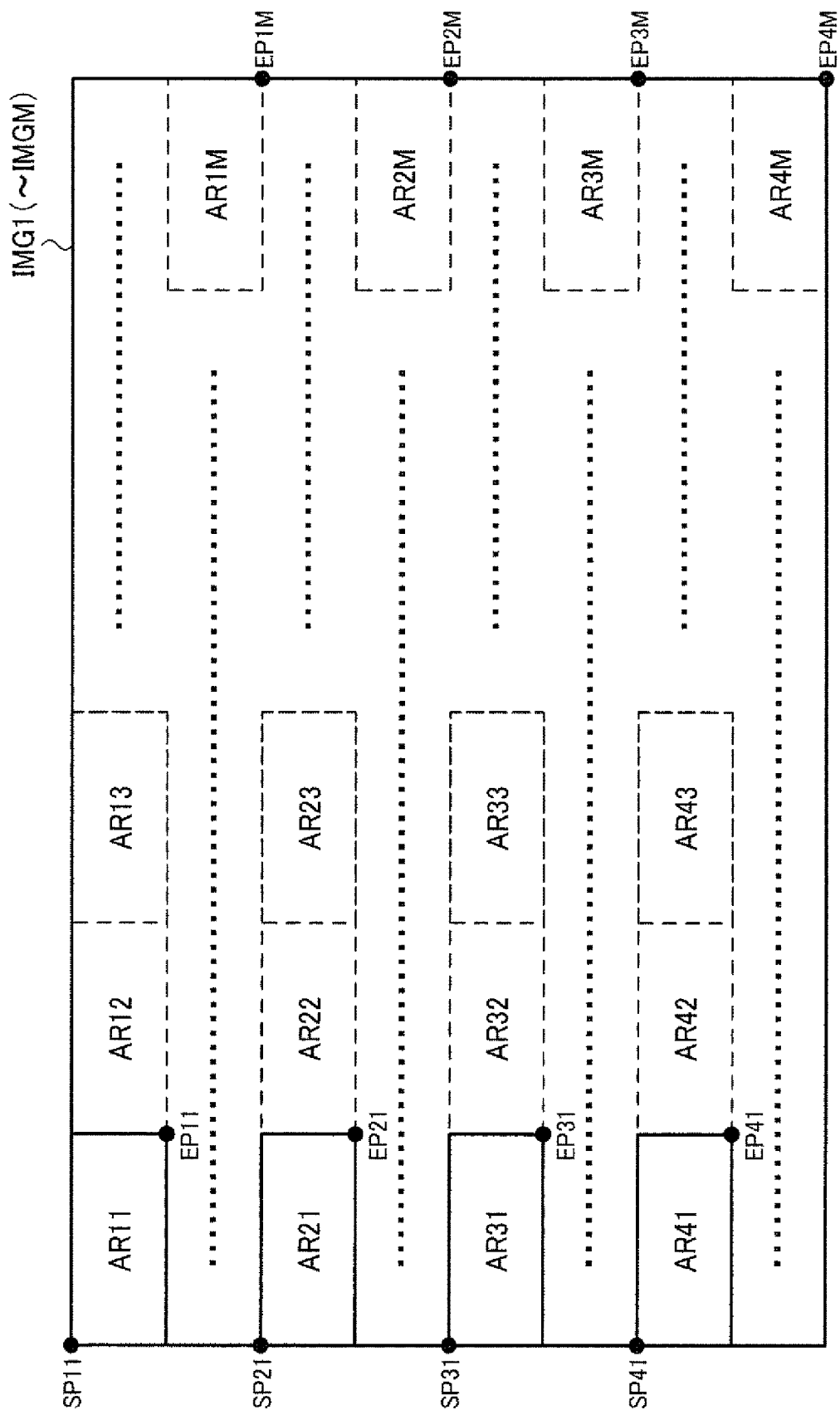
FIG. 15 shows an exemplary setting of the error detection region.

A diagram for describing the fourth method of error detection is shown in FIG. 15. In the fourth method, an image is divided into a plurality of regions, and the divided regions are sequentially selected for each frame, and an error is detected in the selected divided regions as the error detection region. For example, in FIG. 15, eight rows×(M/2) columns of divided regions are set, M (M is an integer of three or more, and M is an even number in the example in FIG. 15) divided regions are arranged in two rows. The divided regions in the first and second rows are denoted by AR11 to AR1M (first group of error detection regions), the divided regions in the third and fourth rows are denoted by AR21 to AR2M (second group of error detection regions), the divided regions in the fifth and sixth rows are denoted by AR31 to AR3M (third group of error detection regions), and the divided regions in the seventh and eighth rows are denoted by AR41 to AR4M (fourth group of error detection regions). The divided regions AR11, AR21, AR31, and AR41 are the error detection regions in a frame image IMG1 in a first frame, and the divided regions AR12, AR22, AR32, and AR42 are the error detection regions in a frame image IMG2 in a second image. This selection of the error detection regions is repeated until an $M^{th}$ frame, and the error detection regions that are the same as those in the first frame are assigned in an $(M+1)^{th}$ frame again.

The error detection regions in each frame are controlled as follows, for example. That is, the processing device 200 writes position information regarding the divided regions (error detection regions) AR11, AR21, AR31, and AR41 into the register unit 150 in the first frame, and writes position information regarding the divided regions (error detection regions) AR12, AR22, AR32, and AR42 into the register unit 150 in the second frame. These operations are repeated until the $M^{th}$ frame so as to control the error detection regions in each frame. In this case, the position information includes coordinates of start and end points of each of the divided regions.

Alternatively, the processing device 200 writes position information (coordinates of start and end points) of the first divided regions AR11, AR21, AR31, and AR41 in the first to fourth error detection regions and position information (coordinates of the end point) of the final divided regions AR1M, AR2M, AR3M, and AR4M to the register unit 150. The error detection unit 130 obtains the coordinates of start and end points of each of the divided regions from these pieces of position information. For example, in the case where the width of the divided region AR11 is 100 pixels, the coordinates obtained by shifting coordinates of a start point SP11 and an end point EP11 of the divided region AR11 by 100 in a horizontal scan direction are the coordinates of a start point and an end point of the divided region AR12. When the coordinates of the end point obtained in this way match the coordinates of an end point EP1M of the divided region AR1M, the region is the final divided region. The error detection unit 130 shifts the divided region by one every time the vertical synchronizing signal is input, updates the register unit 150 with the position information regarding the divided region, and as a result, controls the error detection regions for each frame, for example.

Note that an error may be detected in all of the groups of the first to fourth error detection regions, or an error may be detected in a portion (any one group, two groups, or three groups) thereof. For example, an error may be detected in all of the groups of the first to fourth error detection regions in the first to $M^{th}$ frames, and an error may be detected only in the fourth group of error detection regions in the next $(M+1)^{th}$ to $2M^{th}$ frames. For example, the processing device 200 performs control so as to indicate which of the groups are targeted by writing a register value indicating which of the groups are targeted to the register unit 150. For example, when an upper ¾ of an image is black, and only the lower ¼ of the image is displayed, the fourth group of error detection regions corresponding to the lower ¼ of the image is targeted. Such control is possible because the processing device 200 is aware of the content of the image data. In an image whose image data indicates many continuous black areas, the CRC reliability (error detection rate) decreases, and therefore, by omitting calculation of the CRC value in such a region, the processing load of the processing device 200 can be reduced.

According to the fourth method, the processing load of the processing device 200 can be reduced, similarly to the second and third methods. Also, as a result of sequentially selecting the divided regions for each frame, an error is detected in the entire image, and the occurrence of detection failures of an error can be further reduced.

In the case where a communication error in image data is detected over the entire image, the processing device 200 calculates an expectation value for the error detection with respect to the entire image, and therefore the amount of data that is the target of calculation increases, and the processing load increases. On the other hand, in the case where the error detection region is a fixed region that is smaller than the entire image, although the processing load of the processing device 200 is reduced, an error can be detected only in a portion of the image.

In this regard, in the present embodiment, the circuit device 100 includes the error detection unit 130 that detects an error in image data, and the error signal output unit that outputs an error signal based on the error detection result. Assume that n is an integer of two or more, and i and j are each an integer of one or more and n or less, and satisfy an expression i≠j. An $i^{th}$ frame error detection region is set to an $i^{th}$ frame image of first to $n^{th}$ frame images, and a $j^{th}$ frame error detection region is set to a position that is different from the $i^{th}$ frame error detection region, with respect to a $j^{th}$ frame image of the first to $n^{th}$ frame images. In this case, the error detection unit 130 detects an error based on the image data of the $i^{th}$ frame error detection region and the $j^{th}$ frame error detection region. The error signal output unit outputs an error signal based on the error detection result in the $i^{th}$ frame error detection region and the $j^{th}$ frame error detection region.

According to the present embodiment, an error is detected in the $i^{th}$ frame error detection region in the $i^{th}$ frame image, an error is detected in the $j^{th}$ frame error detection region in the $j^{th}$ frame image, and the positions of the $i^{th}$ and $j^{th}$ frame error detection regions are different. Accordingly, an error can be detected in an error detection region whose position is different for each frame, and an error can be detected in a wider region of the image. Also, since an error is detected in a region that is smaller than the entire image in one frame, the processing load of the processing device 200 can be reduced.

Here, the detecting of an error is to check whether or not the image data that the processing device 200 transmitted to the circuit device 100 matches the image data that the circuit device 100 has actually received (detection of a communication error). Also, the error signal is a signal related to the result of an error detection, and is a signal indicating whether or not an error has been detected in image data, a signal for requesting the processing device 200 to perform some operations according to the error detection result, or the like, for example. Also, a frame image is an image that is displayed (or an image to be displayed) in one frame. For example, when the display in the display panel is updated at a rate of 30 fps (frames per second), the period of one frame is 1/30 seconds, and an image rendered in one frame is the frame image. Note that the frame image, here, is an image at a stage when the processing device 200 is transmitting to the circuit device 100. That is, the finally displayed frame image is not necessarily the same as the frame image on which the error detection is performed, because image processing may be performed therebetween.

For example, in the second method in FIG. 13, n=4. When the case in which i=1 and j=2 is taken as an example, an $i^{th}$ frame error detection region is a region AR1, and a $j^{th}$ frame error detection region is a region AR2. These error detection regions AR1 and AR2 are located at different positions. In the example shown in FIG. 13, the position is indicated by the start point and end point of the region. Note that the indication of the position is not limited thereto, and the position may be indicated by only a start point or by a center point of the region (point where two diagonal lines intersect).

In the third method in FIG. 14, n=2. When i=1 and j=2, the $i^{th}$ frame error detection region is a region AR1, and the $j^{th}$ frame error detection region includes regions AR2 to AR4. In this way, the $i^{th}$ and $j^{th}$ frame error detection regions may each be constituted by a plurality of regions. In this case, the position of the region is indicated by positions (start point and end point, for example) of each of the plurality of regions, and at least one of the plurality of regions needs only be located at different position. For example, in the example in FIG. 14, all regions AR2 to AR4 of the $j^{th}$ frame error detection region are located at positions that are different from that of the $i^{th}$ frame error detection region AR1. The $j^{th}$ frame error detection region may include the regions AR1 and AR2, for example. In this case, the region AR2 is located at a position different from the $i^{th}$ frame error detection region AR1.

In the fourth method in FIG. 15, n=M. When i=1 and j=2, the $i^{th}$ frame error detection region includes regions AR11 to AR41, and the $j^{th}$ frame error detection region includes regions AR12 to AR42.

Also, in the present embodiment, the circuit device 100 includes the register unit 150 for storing the position information regarding each of the $i^{th}$ frame error detection region and the $j^{th}$ frame error detection region. The $i^{th}$ frame error detection region and the $j^{th}$ frame error detection region are set based on the respective pieces of position information stored in the register unit 150.

As described in FIG. 4 and the like, the position information includes coordinates of the start points SP1 to SP4 (coordinates of pixels corresponding to the start points) and coordinates of the end points EP1 to EP4 (coordinates of pixels corresponding to the end points), for example. In this case, the error detection unit 130 sets the rectangle regions whose diagonal lines are lines connecting the respective start points and end points as the error detection regions.

According to the present embodiment, as a result of the position information regarding each of the $i^{th}$ and $j^{th}$ frame error detection regions being written into the register unit 150, error detection regions in which an error is to be detected can be set. Also, as a result of pieces of position information that are different from each other being written into the register unit 150 as the respective pieces of position information regarding the $i^{th}$ and $j^{th}$ frame error detection regions, $i^{th}$ and $j^{th}$ frame error detection regions that are located at different positions can be set.

Also, in the present embodiment, the register unit 150 stores expectation value information for error detection along with the position information regarding each of the $i^{th}$ and $j^{th}$ frame error detection regions. The error detection unit 130 performs the error detection based on the expectation value information.

The expectation value information is obtained by the processing device 200 on the transmission side, and the expectation value information for the $i^{th}$ frame error detection region is obtained by the processing device 200 from the display data for the $i^{th}$ frame error detection region of the display data of the $i^{th}$ frame image, for example.

According to the present embodiment, as a result of the expectation value information for error detection corresponding to each of the $i^{th}$ and $j^{th}$ frame error detection regions being written into the register unit 150, an error can be detected with respect to the $i^{th}$ and $j^{th}$ frame error detection regions.

Also, in the present embodiment, the circuit device 100 includes the interface unit 160. The external processing device 200 sets the position information and expectation value information to the register unit 150 via the interface unit 160.

For example, the position information and the expectation value information are written into the register unit 150 via an interface that is different from that for image data through I2C communication, three-wire or four-wire serial communication, or the like. Alternatively, the expectation value information may be written into the register unit 150 via the interface for image data. In this case, the expectation value information is transmitted in a period in which image data is not transmitted (later-described flyback period, for example). For example, when the image data of one pixel includes 24 bits (8 bits for each of R, G, and B data), and the expectation value information is a 16-bit CRC value, a 16-bit CRC value is embedded in 24-bit data having the same format as the image data, and the 24-bit data is transmitted. For example, the CRC value is assigned to the 16 bits including 8 bits for R data and 8 bits for G data, out of the 8 bits for each of R, G, and B data, and the CRC value is transmitted by the processing device 200. The interface unit 160 extracts the 16 bits including 8 bits for R data and 8 bits for G data out of the received 24 bits, and writes the extracted 16 bits to the register unit 150 as the expectation value information. At what timing the image data including the expectation value information is to be received can be indicated by the timing control performed by the control unit 110 (timing control unit).

According to the present embodiment, the external processing device 200 sets the position information and expectation value information to the register unit 150 via the interface unit 160, and as a result, the error detection region can be set based on the position information, and an error can be detected in the error detection region based on the expectation value information.

Also, in the present embodiment, the expectation value information and position information received in a flyback period of image data are set to the register unit 150.

The flyback period is a period in which image data is not transmitted, and is a vertical flyback period, for example. As shown in FIG. 12, the vertical flyback period is a period (period combining horizontal scan periods in each of which a data valid period does not exist) between a period in which image data of a frame image is transmitted (period combining horizontal scan periods in each of which a data valid period exists) and a period in which image data of the next frame image is transmitted.

The frame image with respect to which the processing device 200 has obtained the expectation value information needs to match the frame image on which the circuit device 100 performs error detection. In this regard, according to the present embodiment, as a result of receiving expectation value information in the flyback period of image data, it is apparent that the expectation value information is the expectation value information regarding the frame image received before the flyback period. Also, the position information regarding the error detection region needs to be obtained prior to performing the error detection. In this regard, according to the present embodiment, as a result of receiving the position information in the flyback period of image data, it is apparent that the position information is the position information regarding the error detection region in the frame image to be received after the flyback period.

Also, in the present embodiment, a plurality of error detection regions are set as each of the $i^{th}$ and $j^{th}$ frame error detection regions.

For example, in the third method in FIG. 14, three error detection regions AR2 to AR4 are set as the error detection region for the second frame. In the fourth method in FIG. 15, four divided regions (AR11 to AR41, for example) are set as the error detection region for each frame.

Also, in the present embodiment, the $i^{th}$ and $j^{th}$ frame error detection regions may be set such that the number (variable number) of regions set in the $i^{th}$ frame error detection region is different from the number of regions set in the $j^{th}$ frame error detection region.

For example, in the third method in FIG. 14, one error detection region AR1 is set as the first frame error detection region, and the three error detection regions AR2 to AR4 are set as the second frame error detection region.

According to the present embodiment, a plurality of error detection regions are set as each of the error detection regions, or a different number of error detection regions are set as each of the error detection regions. Accordingly, flexible setting of the error detection region such as setting an appropriate error detection region according to the content of a display image is made possible. For example, if only in a portion of an image in one frame is displayed, one error detection region is set to the portion in the frame, and if a wide range of an image in another frame that is different from the one frame is displayed, a plurality of error detection regions can be set inside the range in the frame.

Also, as described in FIG. 11, the error detection unit 130 includes the error detection region setting unit 30. The error detection region setting unit 30 sets the regions in which an error is to be detected as each of the $i^{th}$ and $j^{th}$ frame error detection regions from a plurality of error detection regions based on the count value of the frame counter 31.

Specifically, position information regarding each of a plurality of error detection regions is set in the register unit 150, and the error detection region setting unit 30 performs control so as to select an error detection region to be the target of error detection (the error detection region with respect to which an error detection result is to be output) based on the count value. This control corresponds to setting the error detection region based on the count value.

According to the present embodiment, an error detection region to be the target of error detection in each frame is set, out of the plurality of error detection regions. Accordingly, control such as setting a plurality of error detection regions as each of the $i^{th}$ and $j^{th}$ frame error detection regions, and setting a different number of error detection regions as each of the $i^{th}$ and $j^{th}$ frame error detection regions can be performed.

Also, in the present embodiment, the error detection region setting unit 30 sets the error detection region such that a $k^{th}$ frame error detection region in a $k^{th}$ frame image, out of first to $n^{th}$ frame images, and a $(k+1)^{th}$ frame error detection region in a $(k+1)^{th}$ frame image are adjacent to each other, where k is an integer of one or more and n or less.

For example, k=1 and k+1=2 are assumed in the fourth method in FIG. 15. In this case, the $k^{th}$ frame error detection region includes the regions AR11 to AR41, and the $(k+1)^{th}$ frame error detection region includes the regions AR12 to AR42. The regions AR12, AR22, AR32, and AR42 are respectively adjacent to the regions AR11, AR21, AR31, and AR41. Here, regions being adjacent to each other means that one side of one region is adjacent to one side of the other region (there is no pixel therebetween, for example).

According to the present embodiment, the error detection regions are sequentially shifted to the respective adjacent regions for each frame. Accordingly, error detection can be performed on the entire image without a gap, in a period of a plurality of frames, and the accuracy of the error detection can be improved.

In the following, the operations in each method described in FIGS. 4, and 13 to 15 will be described in detail, in association with the exemplary configuration in FIG. 11. The count value of the frame counter 31 is assumed to take values 0 to 15 (returning to 0 after 15), and the count values 0 to 15 are assumed to be associated with first to sixteenth frames, respectively.

For example, in the first method in FIG. 4, all the first to fourth error detection regions AR1 to AR4 are targeted regardless of the count value of the frame counter 31, and the error detection region setting unit 30 causes all the calculators 11 to 14 to calculate CRC values.

In the second method in FIG. 13, the first error detection region AR1 is targeted when the count value of the frame counter 31 is 0, 4, 8, or 12, and second to fourth error detection regions AR2 to AR4 are not targeted. That is, the error detection region setting unit 30 causes the calculator 11 to calculate a CRC value, and disables operations of the calculators 12 to 14. The comparators 22 to 24 associated with the disabled calculators 12 to 14 each output "0" (deactivated). In this case, the processing device 200 writes register values only into the first position information register 51 and the first expectation value register 61. Similarly, when the count value is 1, 5, 9, or 13, the second error detection region AR2 is targeted, when the count value is 2, 6, 10, and 14, the third error detection region AR3 is targeted, and when the count value is 3, 7, 11, and 15, the fourth error detection region AR4 is targeted.

Note that, in the second method, a modified example as follows is conceivable. That is, the processing device 200 writes register values to the first to fourth position information registers 51 to 54 and the first to fourth expectation value registers 61 to 64 in every frame. Also, regardless of the count value, the calculators 11 to 14 calculate respective CRC values, and the comparators 21 to 24 respectively compare the expectation values with the CRC values. When a case where the count value is 0, 4, 8, or 12 is taken as an example, the error detection region setting unit 30 causes the comparator 21 to perform weighting such that the comparison result of the comparator 21 is multiplied by 1, and causes the comparators 22 to 24 to perform weighting such that the comparison results of the comparators 22 to 24 are multiplied by 0. With this, the comparator 21 outputs the comparison result, and the comparators 22 to 24 output "0".

In the third method in FIG. 14, when the count value of the frame counter 31 is 0, 2, 4, 6, 8, 10, 12, or 14, the first error detection region AR1 is targeted, and when the count value of the frame counter 31 is 1, 3, 5, 7, 9, 11, 13, or 15, the second to fourth error detection regions AR2 to AR4 are targeted. The error detection region setting unit 30 controls the calculators 11 to 14 and the comparators 21 to 24, similarly to the second method. A modified example is similarly configured.

In the fourth method in FIG. 15, in the first frame, the processing device 200 writes position information regarding the error detection regions AR11 to AR41 to the first to fourth position information registers 51 to 54, and writes CRC expectation values of the error detection regions AR11 to AR41 to the first to fourth expectation value registers 61 to 64. In the second frame, the processing device 200 writes position information regarding the error detection regions AR12 to AR42 to the first to fourth position information registers 51 to 54, and writes CRC expectation values of the error detection regions AR12 to AR42 to the first to fourth expectation value registers 61 to 64. In the following frames, the regions are similarly shifted. When M=16, for example, error detection regions AR1M to AR4M are targeted in a $16^{th}$ frame.

The error detection region setting unit 30 causes the calculators 11 to 14 to calculate CRC values, and causes the comparators 21 to 24 to output comparison results, regardless of the count value of the frame counter 31. Alternatively, the error detection region setting unit 30 enables one of the calculators 11 to 14, and disables the others. For example, the calculators 11 to 13 are disabled, and the calculator 14 is enabled. In this case, only the fourth group of error detection regions AR41 to AR4M are the target of error detection. Note that, similarly to the modified example described in the second method, similar operations may be realized by weighting performed in the comparators 21 to 24. That is, the calculators 11 to 14 may be caused to calculate CRC values, the comparators 21 to 23 may be caused to multiply comparison results by 0, and the comparator 24 may be caused to multiply a comparison result by 1.

The operations of the error detection region setting unit 30 described above can be realized by register setting, for example. For example, the processing device 200 writes register values indicating which of the calculators 11 to 14 is enabled (or weighting performed in the comparators 21 to 24) at each count value, that is, an enabled calculator of the calculators 11 to 14 is associated with the count value of the frame counter 31, into the register unit 150, and the error detection region setting unit 30 operates referring to the register values. Alternatively, the processing device 200 writes mode setting values for switching between the first to fourth methods into the register unit 150 as the register value, and the error detection region setting unit 30 operates referring to the register values. In this case, which of the calculators 11 to 14 is enabled at each count value (or weighting performed in the comparators 21 to 24) is autonomously controlled by the error detection region setting unit 30.

Figure 16:
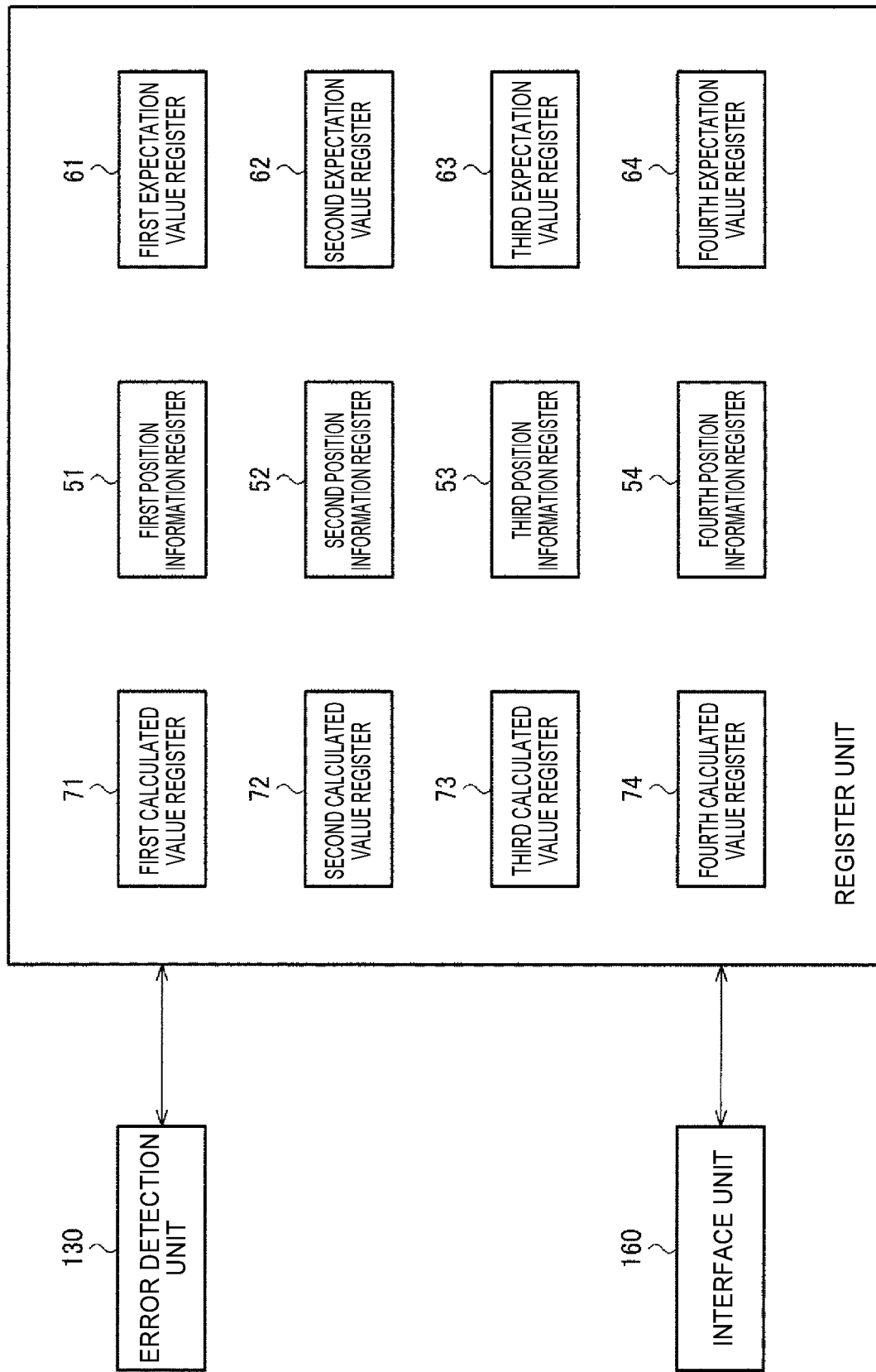
FIG. 16 shows another exemplary configuration of the register unit.

Also, FIG. 16 shows a second detailed exemplary configuration of the register unit 150. In FIG. 16, the register unit 150 further includes first to fourth calculated value registers 71 to 74.

CRC values (CRC calculated values) calculated by the calculators 11 to 14 are stored in the first to fourth calculated value registers 71 to 74. The processing device 200 can read out the CRC values from the first to fourth calculated value registers 71 to 74 via the interface unit 160.

Only the error determination information (interrupt request signal) is input to the processing device 200 from the error determination information output unit 140, and therefore the processing device 200 can recognize a communication error of the image data, but cannot recognize the error detection region in which the error has occurred. In the present embodiment, the processing device 200 can recognize the error detection region in which the error has occurred by referring to the calculated value registers 71 to 74.

The processing device 200, upon receiving an error signal (interrupt request signal), determines the error detection region in which the error has occurred by reading out the CRC values from the calculated value registers 71 to 74, and comparing the CRC values with the respective expectation values. For example, the processing device 200 can perform processing according to the region in which the error has occurred such as causing the circuit device 100 to re-transmit the image data in an area in which the error has occurred for re-rendering.

6. Electro-Optical Device, Electronic Apparatus, and Mobile Body

The method of the present embodiment can be applied to various devices including the above-described circuit device 100. For example, the method of the present embodiment can be applied to an electro-optical device including the circuit device 100 and an electro-optical panel (display panel). Also, the method of the present embodiment can be applied to an electronic apparatus and a mobile body including the circuit device 100.

Figure 17:
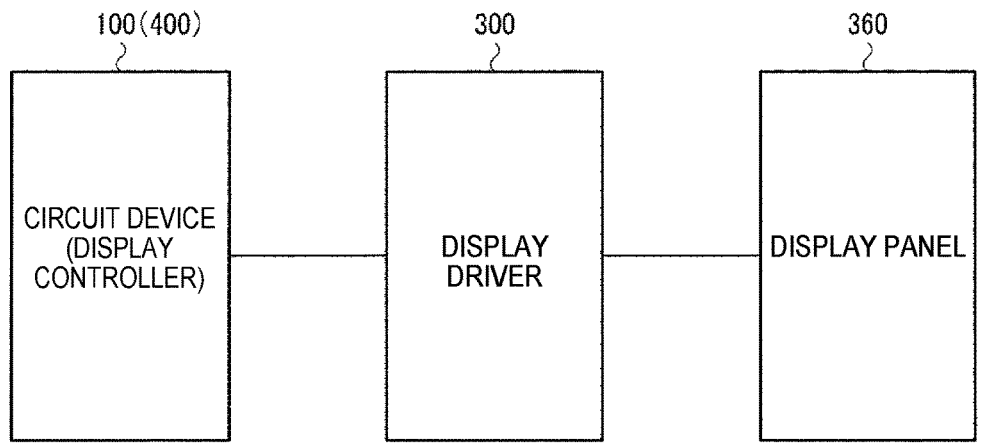
FIG. 17 shows an exemplary configuration of an electro-optical device.

An exemplary configuration of an electro-optical device (display device) that includes the circuit device 100 of the present embodiment is shown in FIG. 17. The electro-optical device includes the circuit device 100 (display controller), a display panel 360, and a display driver 300 that drives the display panel 360 under the control of the circuit device 100.

The display panel 360 is constituted by a glass substrate and a pixel array (liquid crystal cell array) formed on the glass substrate, for example. The pixel array includes pixels, data lines, and scan lines. The display driver 300 is mounted on the glass substrate, and the display driver 300 and the pixel array are connected by an interconnect group that is formed by transparent electrodes (ITO: Indium Tin Oxide). The circuit device 100 is mounted on a circuit board that is different from the glass substrate, and the circuit board and the glass substrate are connected by a flexible board or the like. Note that the electro-optical device is not limited to this configuration. For example, the display driver 300 and the circuit device 100 may be mounted on a circuit board, and the circuit board and the display panel 360 may be connected by a flexible board or the like.

Figure 18:
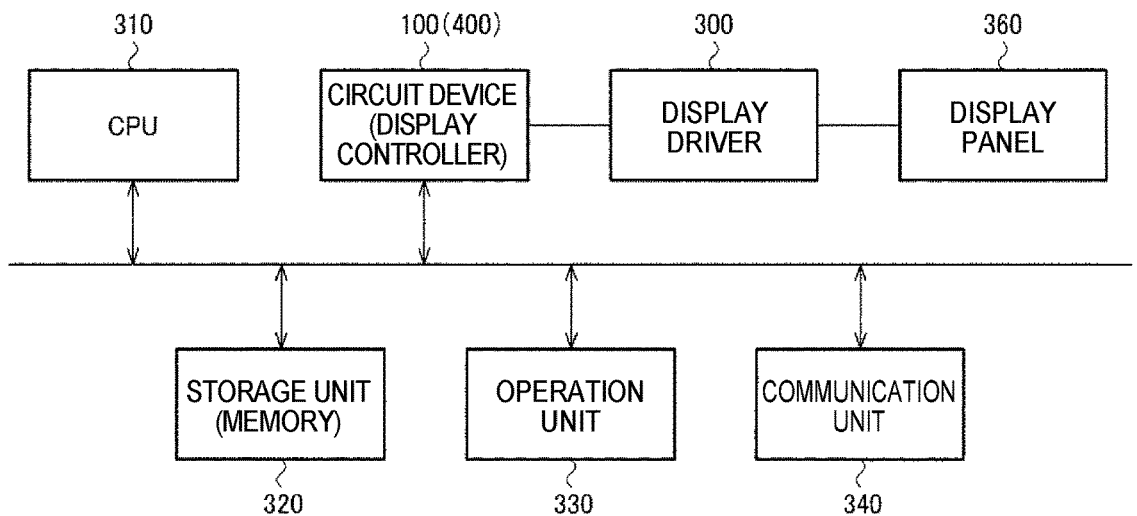
FIG. 18 shows an exemplary configuration of an electronic apparatus.

An exemplary configuration of an electronic apparatus including the circuit device 100 of the present embodiment is shown in FIG. 18. Various electronic apparatuses on which display devices are mounted, such as an in-vehicle display device (such as meter panel, for example), a display, a projector, a television device, an information processing device (computer), a mobile information terminal, a car navigation system, a mobile gate terminal, and a DLP (Digital Light Processing) device, can be envisioned as the electronic apparatus of the present embodiment.

The electronic apparatus includes a CPU 310 (processing device), the circuit device 100 (display controller), the display driver 300, the display panel 360, a storage unit 320 (memory), an operation unit 330 (operation device), and a communication unit 340 (communication circuit, communication device).

The operation unit 330 is a user interface for receiving various operations made by a user. For example, the operation unit 330 is constituted by a button, a mouse, a keyboard, a touch panel attached to the display panel 360, and the like. The communication unit 340 is a data interface for communicating (transmission, reception) image data and control data. For example, the communication unit 340 is a wired communication interface such as a USB or a wireless communication interface such as a wireless LAN, for example. The storage unit 320 stores image data input from the communication unit 340. Alternatively, the storage unit 320 functions as a working memory of the CPU 310. The CPU 310 performs processing to control the units of the electronic apparatus, and various types of data processing. The circuit device 100 performs processing to control the display driver 300. For example, the circuit device 100 converts the format of image data transferred from the communication unit 340 or the storage unit 320 via the CPU 310 to a format that can be accepted by the display driver 300, and outputs the converted image data to the display driver 300. The display driver 300 drives the display panel 360 based on the image data that has been transferred from the circuit device 100.

Figure 19:
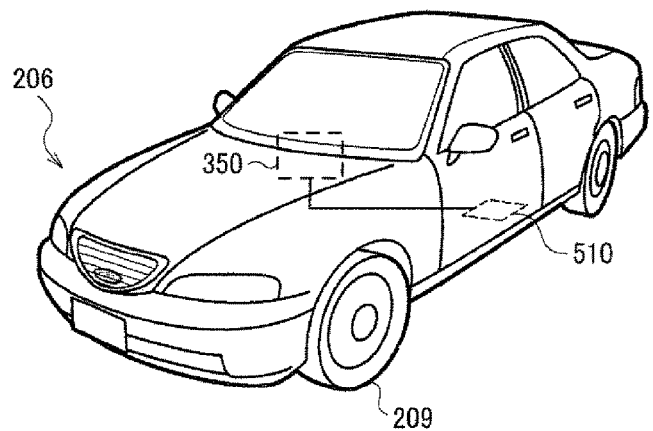
FIG. 19 shows an exemplary configuration of a mobile body.

An exemplary configuration of a mobile body that includes the circuit device 100 of the present embodiment is shown in FIG. 19. Various types of mobile bodies such as a car, an airplane, a motorcycle, a ship, and a robot (mobile robot, walking robot) can be envisioned as a mobile body of the present embodiment, for example. The mobile body is an apparatus or device that includes a drive mechanism such as an engine or a motor, steering mechanisms such as a steering wheel or a rudder, and various electronic apparatus, for example, and moves on the ground, in the air, and on the sea.

FIG. 19 schematically illustrates an automobile 206 serving as a specific example of the mobile body. A display device 350 (electro-optical device) including the circuit device 100, and an ECU 510 that controls the units of the automobile 206 are built into the automobile 206. The ECU 510 generates an image (image data) that shows pieces of information such as speed, remaining fuel amount, travel distance, and settings of various types of devices (air conditioner, for example) to a user, and transmits the image to the display device 350 so as to cause the display panel 360 to display the image.

Note that, although the present embodiment has been described in detail as described above, a person skilled in the art will appreciate that numerous modifications can be made without substantially departing from the novel matter and effects of the invention. Accordingly, all such modifications are intended to be embraced within the scope of the invention. For example, terms that appear in the description or drawings at least once together with other broader or synonymous terms can be replaced by those other terms in any part of the description or drawings. Also, all combinations of the present embodiment and the modifications are embraced within the scope of the invention. Also, the configurations and operations of the circuit device, the processing device, the display driver, the electro-optical device, the electronic apparatus, and the mobile body are not limited to those described in the embodiment, and various modifications can be implemented.

INDUSTRIAL APPLICABILITY

The invention is industrially applicable as a circuit device, an electro-optical device, an electronic apparatus, a mobile body, and an error detection method.

REFERENCE SIGNS LIST

AC1 Integration counter
AN1 AND circuit
AR1 to AR4 Error detection region
CP1 Comparator
DA1-1, DA1-2, DB1-1 to DB1-4 Delay circuit
FC1 Frame counter
11 to 14 Calculator
21 to 24 Comparator
30 Error detection region setting unit
31 Frame counter
51 to 54 Position information register
61 to 64 Expectation value register
71 to 74 Calculated value register
81(81-1 to 81-4) First determination unit
82(82-1 to 82-4) Second determination unit
83(83-1 to 83-4) Third determination unit 100 Circuit device
110, 112 Control unit
120, 122 Image processing unit
130, 131, 132 Error detection unit
140, 141, 142 Error determination information output unit
150, 151, 152 Register unit
160, 161, 162, 170 Interface unit
181, 182 Control unit
191, 192 Drive unit
200 Processing device
206 Automobile
300 Display driver
320 Storage unit
330 Operation unit
340 Communication unit
350 Display device
360 Display panel
400 Display controller

The invention claimed is:

1. A circuit device comprising:
one or more circuits configured to
receive image data; and
perform error detection on the received image data,
wherein the one or more circuits
receive the image data including display image data and error detection data that includes at least position information regarding an error detection region, and
perform the error detection on the display image data based on the display image data of the error detection region that is specified by the position information.

2. The circuit device according to claim 1,
wherein the error detection data further includes expectation value information that is used in the error detection, and
the one or more circuits perform the error detection based on the expectation value information.

3. The circuit device according to claim 1,
wherein the image data includes second to $n^{th}$ pieces of error detection data (n is an integer of two or more), and
$i^{th}$ (i is an integer that satisfies $2 \le i \le n$) error detection data of the second to $n^{th}$ pieces of error detection data includes the position information corresponding to an $i^{th}$ error detection region.

4. The circuit device according to claim 1,
wherein the one or more circuits perform the error detection on the display image data based on the error detection data that is added to a non-display region of the display image data.

5. The circuit device according to claim 1,
wherein the one or more circuits
perform the error detection by computing a respective error detection code in a plurality of error detection regions of the image data, and
output error determination information with respect to the plurality of error detection regions based on the error detection code in a plurality of video frames.

6. The circuit device according to claim 5,
wherein the one or more circuits output first error determination information as the error determination information based on a result of comparison between the error detection code in a $j^{th}$ video frame (j is an integer of one or more) and the error detection code in a $(j+1)^{th}$ video frame.

7. The circuit device according to claim 5,
wherein the one or more circuits output second error determination information as the error determination information when an integrated value of a number of error detection times based on the error detection code reaches a given number of times.

8. The circuit device according to claim 5,
wherein the one or more circuits output third error determination information as the error determination information when an error is detected based on the error detection code in each of a successive given number of video frames.

9. The circuit device according to claim 5,
wherein the one or more circuits
perform operation control on the circuit device,
output a plurality of pieces of error determination information for which determination processing with respect to the error detection code is different from each other, and
perform the operation control based on at least one of the error detection regions in which an error has been determined, out of the plurality of error detection regions, and the error determination information that has been output, out of the plurality of pieces of error determination information.

10. The circuit device according to claim 5, wherein a $j^{th}$ video frame error detection region and a $k^{th}$ video frame error detection region are set such that a number of regions in the $j^{th}$ video frame error detection region and a number of regions in the $k^{th}$ video frame error detection region are different (j and k are integers of one or more, j≠k).

11. An electro-optical device comprising:
the circuit device according to claim 1; and
an electro-optical panel configured to be driven based on signals from the circuit device.

12. An electronic apparatus comprising the circuit device according to claim 1.

13. A mobile body comprising the circuit device according to claim 1.

14. The circuit device according to claim 1, wherein
the error detection is performed by calculating a first value and comparing the first value to a second value contained in the received error detection data, and
the error detection is performed only in the error detection region.

15. An error detection method comprising:
receiving, by one or more circuits, image data including display image data and error detection data that includes at least position information regarding an error detection region; and
performing, by the one or more circuits, error detection on the display image data based on the display image data of the error detection region that is specified by the position information.

16. The error detection method according to claim 15, wherein
the error detection is performed by calculating a first value and comparing the first value to a second value contained in the received error detection data, and
the error detection is performed only in the error detection region.

* * * * *